United States Patent
Byrnes et al.

(10) Patent No.: US 11,159,121 B2
(45) Date of Patent: Oct. 26, 2021

(54) DEPLOYABLE LAND-BASED SOLAR ENERGY COLLECTION SYSTEM

(71) Applicants: John T. Byrnes, Marietta, NY (US); Kevin J. Byrnes, Marietta, NY (US)

(72) Inventors: John T. Byrnes, Marietta, NY (US); Kevin J. Byrnes, Marietta, NY (US)

(73) Assignee: FSWM TECHNICAL ENTERPRISES, INC., Marietta, NY (US)

( * ) Notice: Subject to any disclaimer, the term of this patent is extended or adjusted under 35 U.S.C. 154(b) by 342 days.

(21) Appl. No.: 16/043,993

(22) Filed: Jul. 24, 2018

(65) Prior Publication Data

US 2018/0337632 A1 Nov. 22, 2018

Related U.S. Application Data

(63) Continuation-in-part of application No. 15/877,885, filed on Jan. 23, 2018, now Pat. No. 10,742,039.
(Continued)

(51) Int. Cl.
*H02S 30/20* (2014.01)
*H02S 20/10* (2014.01)
(Continued)

(52) U.S. Cl.
CPC .............. *H02S 30/20* (2014.12); *B65G 17/00* (2013.01); *F03D 9/11* (2016.05); *F03D 9/32* (2016.05); *F03D 13/20* (2016.05); *H01L 31/02* (2013.01); *H02S 10/12* (2014.12); *H02S 10/40* (2014.12); *H02S 20/10* (2014.12); *H02S 40/34* (2014.12); *B65G 2201/02* (2013.01);
(Continued)

(58) Field of Classification Search
CPC . F03D 9/008; F03D 9/007; F03D 9/10; H02S 20/00; H02S 40/36; H02S 30/20; H02S 20/10; H02S 20/30; F03B 13/142; F03B 13/1815; F03B 13/24; F03B 13/14; F05B 2220/708; F05B 2240/93; F05B 2260/02; H02J 3/383; H02J 3/386; H01L 31/05
See application file for complete search history.

(56) References Cited

U.S. PATENT DOCUMENTS 4,553,037 A * 11/1985 Veazey ................... F03D 9/25
290/55
4,574,160 A * 3/1986 Cull ................... H01L 31/0508
136/245
(Continued)

*Primary Examiner* — Golam Mowla
(74) *Attorney, Agent, or Firm* — Bernhard P. Molldrem, Jr.

(57) ABSTRACT

A permanently fixed or transportable power generation station employs one or more shelter structures, containing a chain or series of photovoltaic solar panels on wheeled support frames, each hinged one to the next. The system can be deployed onto a large, relatively flat land area, e.g., unprepared or prepared land surfaces, where the solar panel chain(s) can be extended out and secured by various attachment methods which may include external tracks, cable or bracket attachment systems. Wind turbines on the housings can be raised or tipped up for collection of wind-generated energy. The captured energy is stored in a bank of housed storage batteries and can be delivered to the local electric grid, used for electric vehicle charging stations or provided for primary or back-up power to critical infrastructure.

12 Claims, 33 Drawing Sheets

Related U.S. Application Data

(60) Provisional application No. 62/450,097, filed on Jan. 25, 2017.

(51) Int. Cl.

| | | |
|---|---|---|
| *H02S 10/12* | (2014.01) | |
| *H02S 40/34* | (2014.01) | |
| *F03D 9/11* | (2016.01) | |
| *B65G 17/00* | (2006.01) | |
| *F03D 9/32* | (2016.01) | |
| *F03D 13/20* | (2016.01) | |
| *H01L 31/02* | (2006.01) | |
| *H02S 10/40* | (2014.01) | |
| *F03D 9/00* | (2016.01) | |
| *F03D 7/02* | (2006.01) | |

(52) U.S. Cl.
CPC ............ *F03D 7/0268* (2013.01); *F03D 9/007* (2013.01); *F05B 2220/708* (2013.01); *F05B 2240/9152* (2013.01); *F05B 2240/94* (2013.01)

(56) References Cited

U.S. PATENT DOCUMENTS

| | | | | |
|---|---|---|---|---|
| 4,713,492 A | * | 12/1987 | Hanak | H02S 30/20 136/245 |
| 5,236,378 A | * | 8/1993 | Newman | B60L 8/00 440/6 |
| 5,280,270 A | * | 1/1994 | Correa | B60Q 1/50 340/471 |
| 5,289,999 A | * | 3/1994 | Naujeck | H01L 31/048 136/244 |
| 5,512,787 A | * | 4/1996 | Dederick | F03D 15/10 290/4 R |
| 5,520,747 A | * | 5/1996 | Marks | H01L 31/0547 136/245 |
| 5,961,738 A | * | 10/1999 | Benton | B64G 1/44 136/245 |
| 6,000,353 A | * | 12/1999 | De Leu | B63B 1/121 114/61.1 |
| 6,010,096 A | * | 1/2000 | Baghdasarian | B64G 1/443 244/172.6 |
| 6,147,294 A | * | 11/2000 | Dailey | B64G 1/222 136/245 |
| 7,047,902 B1 | * | 5/2006 | Little | B63B 17/02 114/361 |
| 2008/0196758 A1 | * | 8/2008 | McGuire | F03D 9/007 136/245 |
| 2009/0133732 A1 | * | 5/2009 | Hsia | H02S 20/00 136/206 |
| 2009/0315330 A1 | * | 12/2009 | Dederick | F03B 13/268 290/53 |
| 2011/0146751 A1 | * | 6/2011 | McGuire | F24S 30/425 136/245 |
| 2013/0240015 A1 | | 9/2013 | Chaimovski et al. | |
| 2014/0338720 A1 | * | 11/2014 | Caster | H02S 30/20 136/245 |
| 2015/0013750 A1 | * | 1/2015 | Meppelink | F24S 25/70 136/245 |
| 2015/0162865 A1 | * | 6/2015 | Cowham | F24S 25/70 136/251 |
| 2016/0036375 A1 | | 2/2016 | Ansari | |

\* cited by examiner

DEPLOYABLE LAND-BASED SOLAR ENERGY COLLECTION SYSTEM

This is a continuation-in-part of co-pending application Ser. No. 15/877,885, filed Jan. 23, 2018, which claims the priority of Provisional Application Ser. No. 62/450,097, filed Jan. 25, 2017. The entire disclosure of both said applications are incorporated by reference herein.

BACKGROUND OF THE INVENTION

The threat of a loss of electric power due to hurricanes or other storms, as well as the possibility of loss grid power from accidental or deliberate attack on the power grid has become much greater in recent years, as dependency on utility-supplied electric power has grown. In many cases, if a power generation, transmission line, or power substation goes off-line for any reason, it may take at least a few days and up to a number of weeks to restore power to customers. Also, during severe temperature conditions, the power draw for air conditioning or heating can create a power brown-out condition where the power generation equipment cannot keep up with power demand. Consequently dependable power-generation capability, to provide power back-up and also to provide supplemental power during times of peak demand, is a definite requirement to assure day-to-day needs are met for electricity, both residential and commercial.

Ideally, back-up power can be supplied from natural or renewable primary power sources, e.g., solar or photovoltaic (PV) panels or wind power in land-based applications. Favorably the power generated there can be stored and later made available from storage batteries, or other storage means such as compressed air. In an ideal situation, solar energy can be collected and stored, and then supplied to a municipality, the grid or other location when the supplemental or back-up power is needed. Energy can be collected and stored at an out-of-the way location, and then brought to a municipality or other location when the supplemental or back-up power is needed. Also, because the location of storm damage is not known in advance, the back up or supplemental energy storage system can be mobile or transportable systems, so that they may be quickly brought to the location where the power is needed, and then returned to a remote or out-of-the way energy collection location when the crisis ends. Alternatively, the deployable solar and/or wind power collection systems with associated back up or supplemental energy storage systems can be permanently and statically installed in areas or locations that are subject to frequent severe storms.

The proposed solution to this need employs storm-resistant, modular energy collection stations, including energy collection source(s)—solar or wind, and means for storing the energy, e.g., a bank of storage batteries, which are capable of retracting or shielding said energy collection source(s) during severe storms and then deploying energy collection source(s) after severe storms are no longer present and delivering the energy to the local or regional power system where supplemental or back-up power is needed.

The overall concept concerns a moderate-to-large energy collection and storage system, that can be permanently-installed, or transportable, to collect electric energy from solar panels and wind turbines, that can be quickly deployed and deployed, and to store energy in battery banks which are also housed in the system's storm-resistant, modular containers or housings, for this purpose. This allows the system to avoid storm damage by withdrawing the energy collection equipment into the storm-resistant shelters when there is severe weather, and then re-deploying the energy collection equipment, i.e., solar PV panels and/or wind turbines, after the storm has passed.

The present invention locates wind and/or solar generation equipment statically with equipment that can be deployed out from a storage housing or container module at a location where there is open space where arrays of the solar or PV panels can be deployed. In a land setting, e.g. on open land areas, parking lots or other prepared land surfaces, chains of interconnected wheeled PV panels can be extended out onto the land surface. The equipment may also include deployable and retractable wind turbine towers. The modular housings or containers can be transported or statically installed, with the power collection equipment being configured to be withdrawn into storage the modular housings/storage containers during or just prior to a severe weather event, and then again deployed after severe storm conditions have ceased, to rapidly and reliably restart energy collection where the supplemental or replacement power is needed after severe storm conditions have ceased, and such that the stored energy can be placed into the local or regional power system, or used to supply critical infrastructure, from that point.

Solar power and wind power may each be used as primary power for charging an included battery bank for energy storage, and the stored energy from the battery storage can be used later to generate electrical power at proper voltage, phase, and frequency where the power is needed.

A land based energy generation system constructed in this way can deploy a chain of solar panels across a flat space, e.g. a large parking lot, and may also include a wind turbine to capture wind energy. Wheels or rollers may be used with the linked-up photovoltaic panels, rather than floats (as used in the copending Ser. No. 15/877,885). Wheeled solar panel support frames may be deployed in conjunction with external tracks, adjustable frameworks and moveable track sections, to link to internal tracks within the housings or containers. Alternatively, wheeled solar panel support frames may be deployed onto prepared land surfaces that may include formed concrete surfaces or formed metal to facilitate flat surfaces for the wheeled support frames to deploy onto.

Arrangements for the energy collection and storage system according to this concept can be configured, for example, as discussed here.

OBJECTS AND SUMMARY OF THE INVENTION

In the system according to an embodiment of this invention, photovoltaic solar panels are arranged on a chain of wheeled support panels or rolling platforms, each hinged one to the next (much like the treads of a tracked vehicle). These are contained in a modular storage structure, e.g., a steel storage container or housing, that is statically installed or mobile, where the system can be deployed onto a large flat area, e.g., an open or prepared land surface, raised modular structures or an open parking lot, where the solar panel chain(s) can be extended out for some distance. The system's air turbines or wind turbines can be raised or tipped up for collection of wind energy. The captured energy is stored in a bank of housed storage batteries, so that energy can be collected and stored before it is needed, and the collected energy can be rapidly supplied when and where the energy is needed, and the stored energy can be fed into the municipality's electric system as needed to supplement the generated electricity. These housings or modular containers can be mobile or statically installed and provided within a short time to any place where power is needed, e.g., following a hurricane or other storm, or after any other power outage or emergency.

A principal object of the invention is to be able to reliably "farm" energy using readily available renewable energy collection equipment, e.g., PV solar or wind turbine, in a form that can be deployed quickly and quickly retracted, primarily in locations of the world that are subject to frequent severe storms.

Main important aspects and advantages of these systems are as follows:

a. Rapid deployment/rapid retraction methods and mechanisms for a large-area, land-based string of solar or PV arrays, i.e., interlocking wheeled support frames custom fitted to solar PV panels, roller wheels which are easily and quickly retracted when conditions dictate. The PV panels may be typical solar panels, "thin film" PV or flexible PV and can be attached to the wheeled support frames for easy deployment.

b. Modular storage structures, e.g., a steel storage container or housing, which allow for retraction of solar PV's to enhance resistance to or avoidance of damage associated with severe storms.

c. Modular storage structures, e.g., a steel storage container or housing, may be mobile or permanently-installed, to include moveable deployment doors or ramps to allow for rapid deployment and retraction of wheeled support frames/fitted solar PV energy collection arrays.

d. Modular storage structures, e.g., a steel storage container or housing, which may be mobile or permanently-installed and recessed below surrounding land surfaces through surface preparation, such that enhanced storm resistance is achieved.

e. Solar PV collection arrays that may be deployed onto the top of modular storage structures, e.g., a steel storage container or housing, which may be mobile or permanently-installed as to allow for longer arrays of linked-wheeled support panels/solar PV collection arrays.

f. Deployment systems may include raised external track systems which include moveable track sections for linking to tracks located within modular storage structures, e.g., steel storage container or housings. External tracks are utilized to guide wheeled support frames fitted with solar panels and to prevent linked-wheeled support frames/solar PV collection arrays from being dislocated by 'lifting' forces caused by axial or radial wind currents.

g. Linked-wheeled support frames/solar PV collection arrays may be applied on flat, prepared land surfaces, or elevated flat surfaces without external track deployment systems by utilizing attachment systems such as taut cable and/or rod with included latching devices or 'bar/bracket' systems. These alternate deployment attachment systems prevent linked-wheeled support frames/solar PV collection arrays from being dislocated by 'lifting' forces caused by axial or radial wind currents.

h. Deployments of solar PV arrays may utilize "wind-shielding" features located at the edges of deployed solar panel arrays. These features may include formed metal panels or formed concrete shapes to prevent linked-wheeled support frames/solar PV collection arrays from being dislocated by 'lifting' forces caused by axial or radial wind currents.

i. Methods and equipment to clean the solar panels may be used at the time of deployment or retraction to remove debris and/or residue that might impede the energy collection capabilities of the PV panels, including spray or mechanical wash, radiant or air drying.

j. Rapid deployment/rapid retraction methods (or mechanisms) for wind energy collection devices e.g., windmills or turbine energy devices, can include collapsible or extending support frames, folding or hinged wind turbine towers for such energy collection devices.

k. Combinations of the wind and photovoltaic energy collection devices feed housed battery banks to store the collected energy. There may be a permanent connection to the grid.

l. The combination of features and equipment may be mobile or permanently-installed on open land (e.g., prepared land surfaces, raised modular structures, parking lot locations).

m. Equipment for converting the stored energy to high-voltage AC to feed the local power system can be located in storm resistant housings or modular containers, to receive the DC energy from the storage battery banks.

n. Power collected from deployable solar panel arrays may be transferred to a collection point by the application of commercial festoon systems that carry a moveable power wire/cable during deployment or retraction of said solar PV arrays. Alternatively, rotating 'swing arms' may be utilized (similar to car-wash hose-carry mechanisms) to carry the moveable power wire, internal to the modular storage structures, e.g., a steel storage container or housing.

In several illustrative embodiments of the invention, a fixed or transportable energy collection and storage station is made up of at least one linear array of photovoltaic panels including linkages connecting the panels one to the next in the form of a chain of interconnected panels. A housing, which can be a steel shipping container or the like, in which the array of photovoltaic panels is stored, has a deployment port through which the linear array of photovoltaic panels are deployed out and through which the array of photovoltaic panels are retracted back in. There is at least one track affixed as a coil or loop within the housing and each such track is configured to carry one of the linear arrays of photovoltaic panels, with each of the panels having at least one traveler member therein, e.g., wheel or roller, that engaging the track and is held in the track such the photovoltaic panels are limited to motion in a direction along the track. A drive mechanism, e.g., drive sprockets powered by a reversible motor, with racks on the support frames, moves the photovoltaic panels along the track(s) for deploying the photovoltaic panels out the deployment port onto the land surface and retracting the linear array of panels back into the housing.

The land surface in which the array of solar panels are supported when deployed can take the form of a track formed of a pair of rails of C-shaped profile, such as the rails frequently used for overhead doors. Alternatively, the land surface can employ a pair of rigid solid ribbon surfaces, e.g., steel or poured concrete on which the traveler member (e.g., rollers or wheels) of the panels can travel. These may include raised flat sections shaped to serve as wind deflectors.

The internal track can take the form of two coils of rail of generally C-shaped profile, such that the internal track has a substantially horizontal lower portion, a substantially horizontal upper portion, and at least one substantially vertical portion joining the lower and upper portions. The external track members extend from outside the deployment port, and there can be at least one rotatable bridging member adapted for joining the internal track and the external track members. Alternatively, the deployment door may have attached roller(s) instead of the rotating bridging member, as illustrated in some of the embodiments discussed below.

Favorably, the photovoltaic panels each can include a photoelectric upper portion that converts sunlight to electricity, and a carriage or frame beneath the upper portion on which the upper portion is mounted. Each carriage can have, as the afore-mentioned travelers, rollers or wheels that ride in the rail members and can roll on the concrete or steel ribbon members.

A pair of guide wires, or in some cases a single taut guide wire or cable extends outward along the land surface from the deployment port; and each carriage includes one or more corresponding cam actuated hook latch(es) adapted to latch onto the guide wire or cable when the associated photovoltaic panel exits said deployment port. A long rigid rod or beam can serve as the equivalent of the guide wire.

The drive mechanism can include a pair of drive sprockets situated at left and right sides of the deployment port and with each of said carriages having left and right toothed rack members along left and right edge, configured to engage the drive sprockets. Favorable, the drive sprockets can be configured as roller sprockets, with each including a ring of roller members supported between a pair of sprocket disks. Alternatively, the drive mechanism can comprise powered wheels and/or tires that engage the wheeled support panels via friction, and also provide the motive force reversely to withdraw the panels back in.

BRIEF DESCRIPTION OF THE DRAWING

Illustrative embodiments of this invention are shown in the Drawing Figures.

DETAILED DESCRIPTION OF PREFERRED EMBODIMENT(S)

Figure 1:
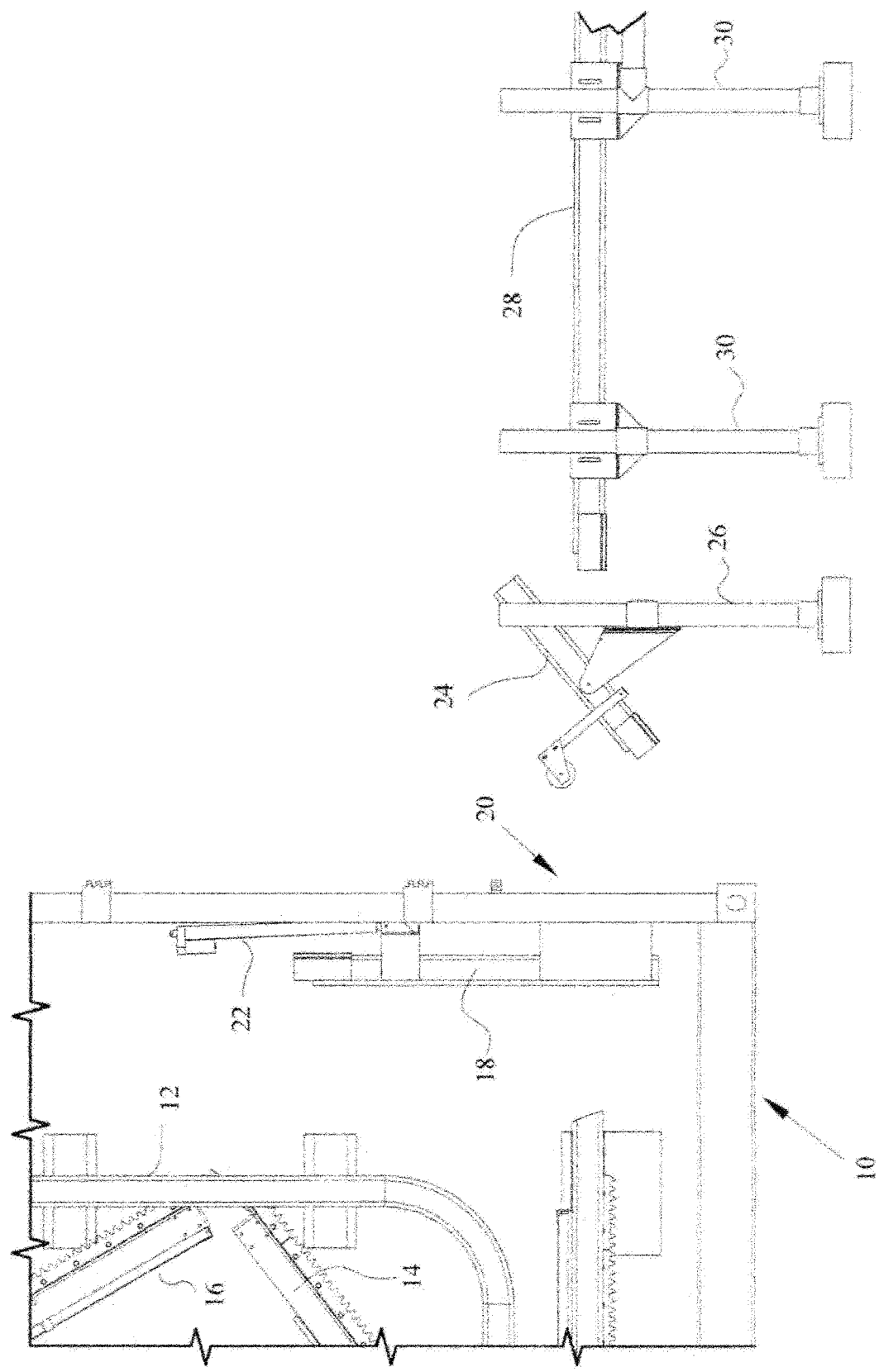
FIG. 1 is a partial side view of a modular storage structure according to one embodiment of this invention, e.g., a steel storage container or housing here cut-away to reveal retracted wheeled-support frames, fitted solar panels, a closed deployment door/actuator, external track and moveable track bridge in the disengaged position.
Figure 2:
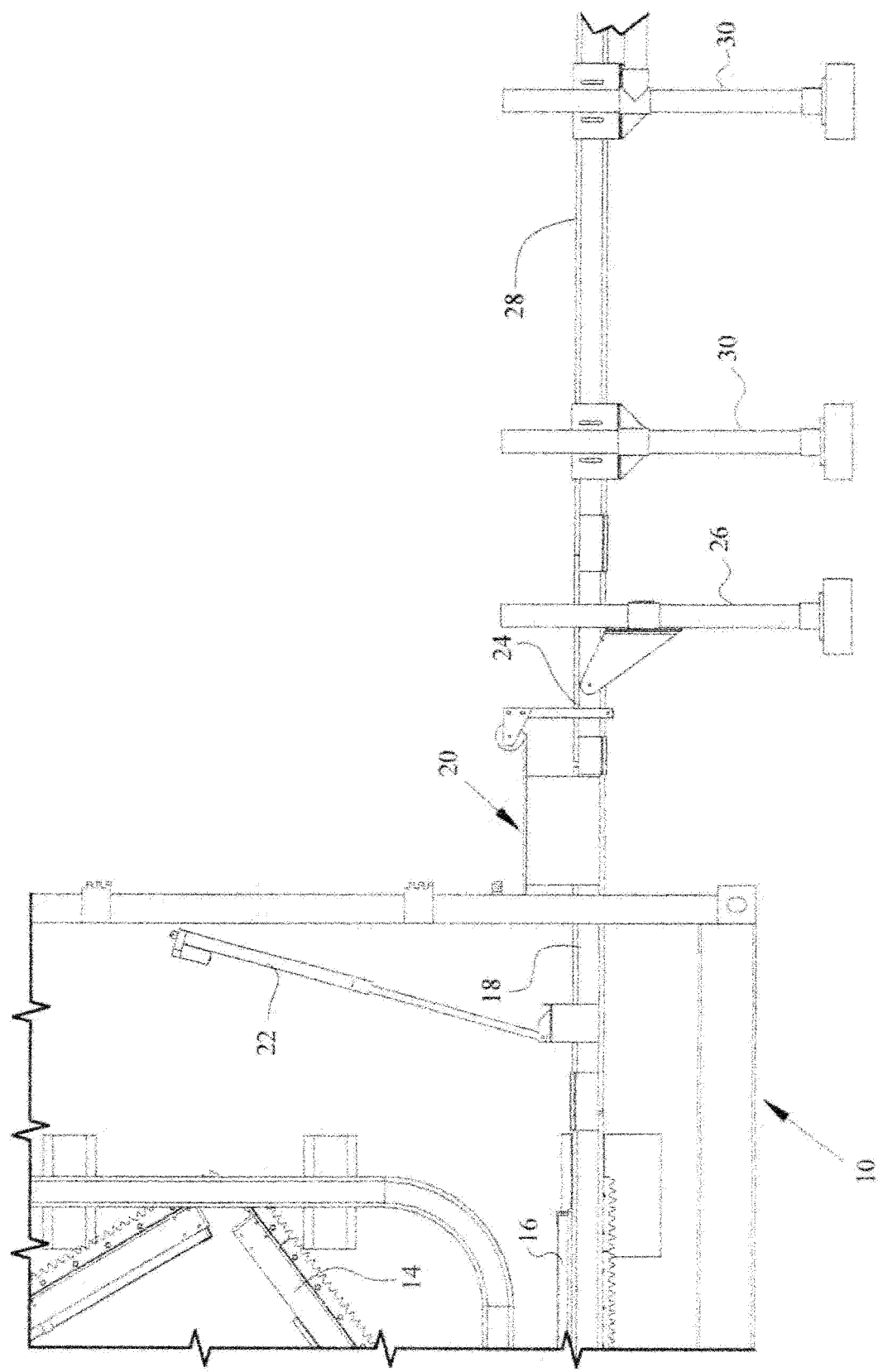
FIG. 2 is another partial side view thereof, here cut-away to reveal retracted wheeled support frames/fitted solar panels, an open deployment door/actuator, external track and moveable bridge track section in the engaged position.
Figure 3:
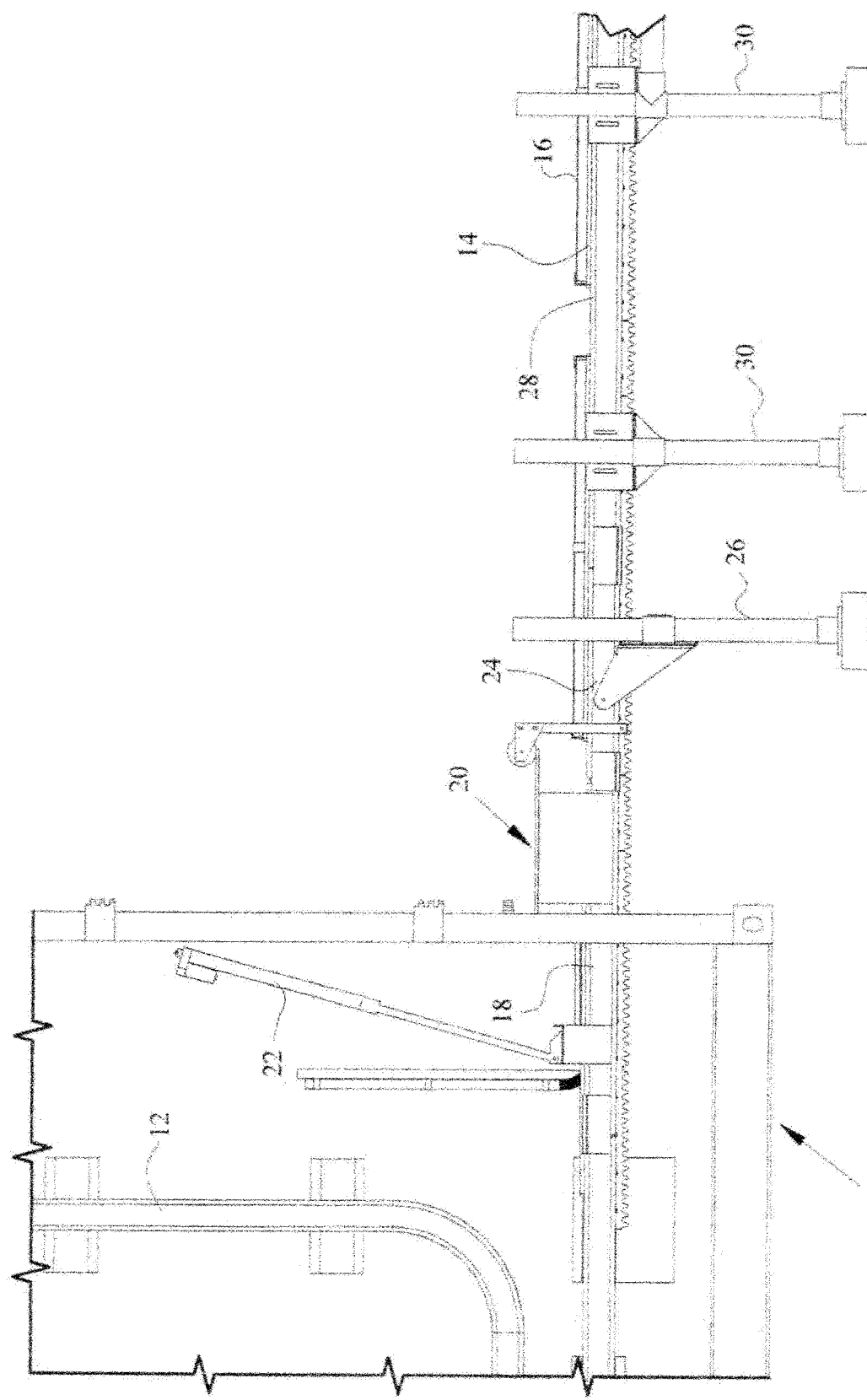
FIG. 3 is another partial side view thereof, here cut-away to reveal partially deployed, wheeled support frames/fitted solar panels, an open deployment door/actuator, external track and moveable bridge track section in the engaged position.

With reference to the Drawing Figures, and initially to FIGS. 1 to 6, FIG. 1 is a side view of a front portion of a modular storage structure, e.g., a steel storage container or housing 10, here cut away to reveal an internal track 12 with retracted or stored wheeled support frames 14 or carriages, and respective solar panels 16 fitted into the support frames 14. An internal moveable track section 18 is mounted on a lower deployment door 20 and swings down when the door 20 is opened to engage with the end of the internal track 12. An external rotating bridge track section 24 supported on an adjustable support post 26 is rotatable to engage with the track section 18 and with an external track 28, also supported by a series of adjustable support brackets 30. The bridge track section 24 here is shown disengaged. As shown in FIG. 2, a deployment door actuator 22 causes the hinged, moveable deployment door 20 and the associated/attached internal track section 18 to rotate. When the deployment door 20 is rotated by the deployment door actuator 22 to the open position, the deployment door contacts a roller at one end of a lever arm of the external, rotating bridge track section 24, and causes the external, rotating bridge track section 24 to rotate to the engaged position, joining the external track 28 to the internal track 12. As shown in FIG. 3, once the internal track 12 is joined to the external track 28, the solar panels 16 and their support frames 14 can be sent outward from the internal track 12 where they are stored inside the container 10 and onto the external track 28.

Figure 4:
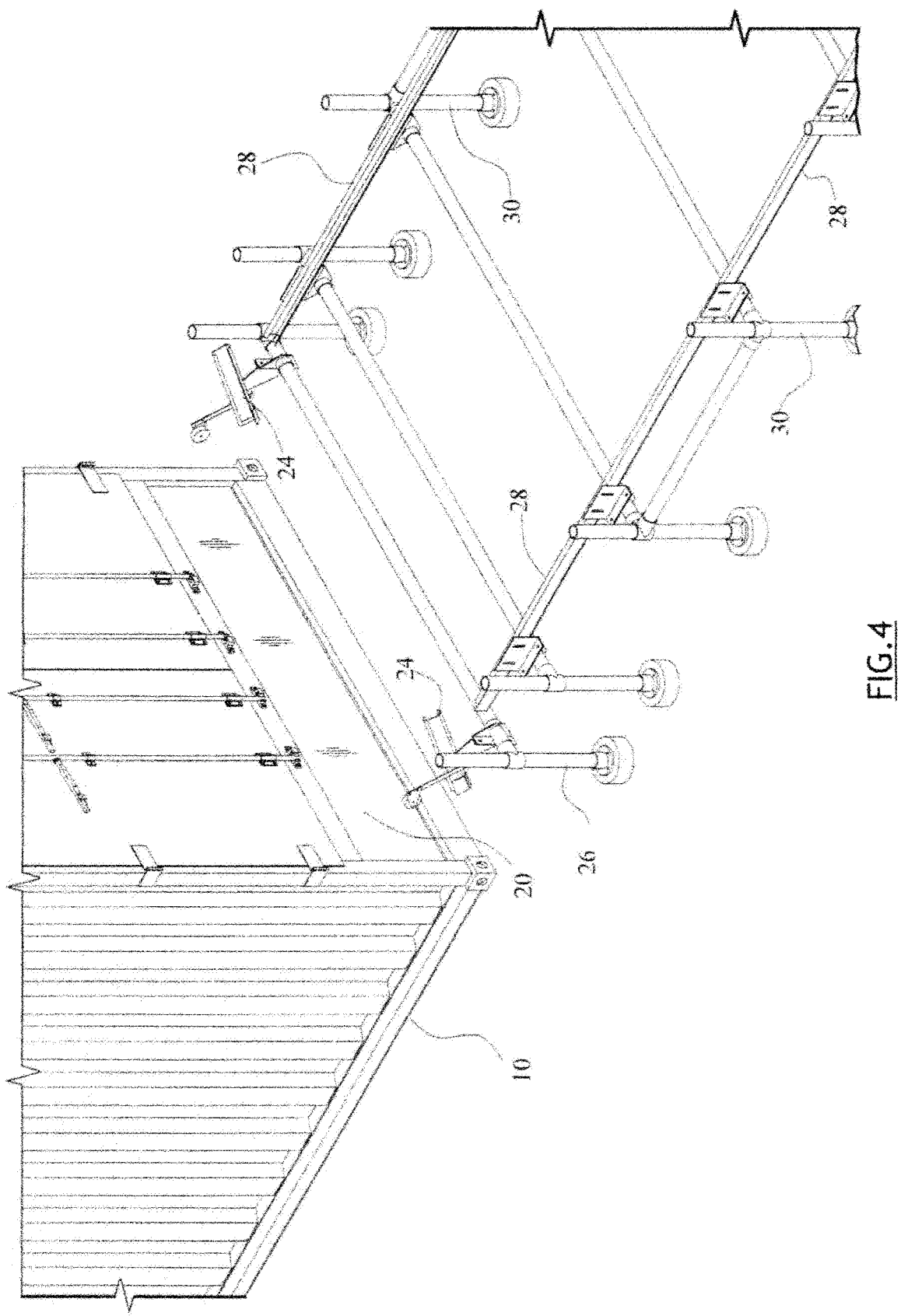
FIG. 4 is a partial isometric view of the modular storage structure of this embodiment, e.g., a steel storage container or housing with the deployment door closed, external track, a rotating external track bridge (disengaged) and adjustable, modular support posts/brackets.
Figure 5:
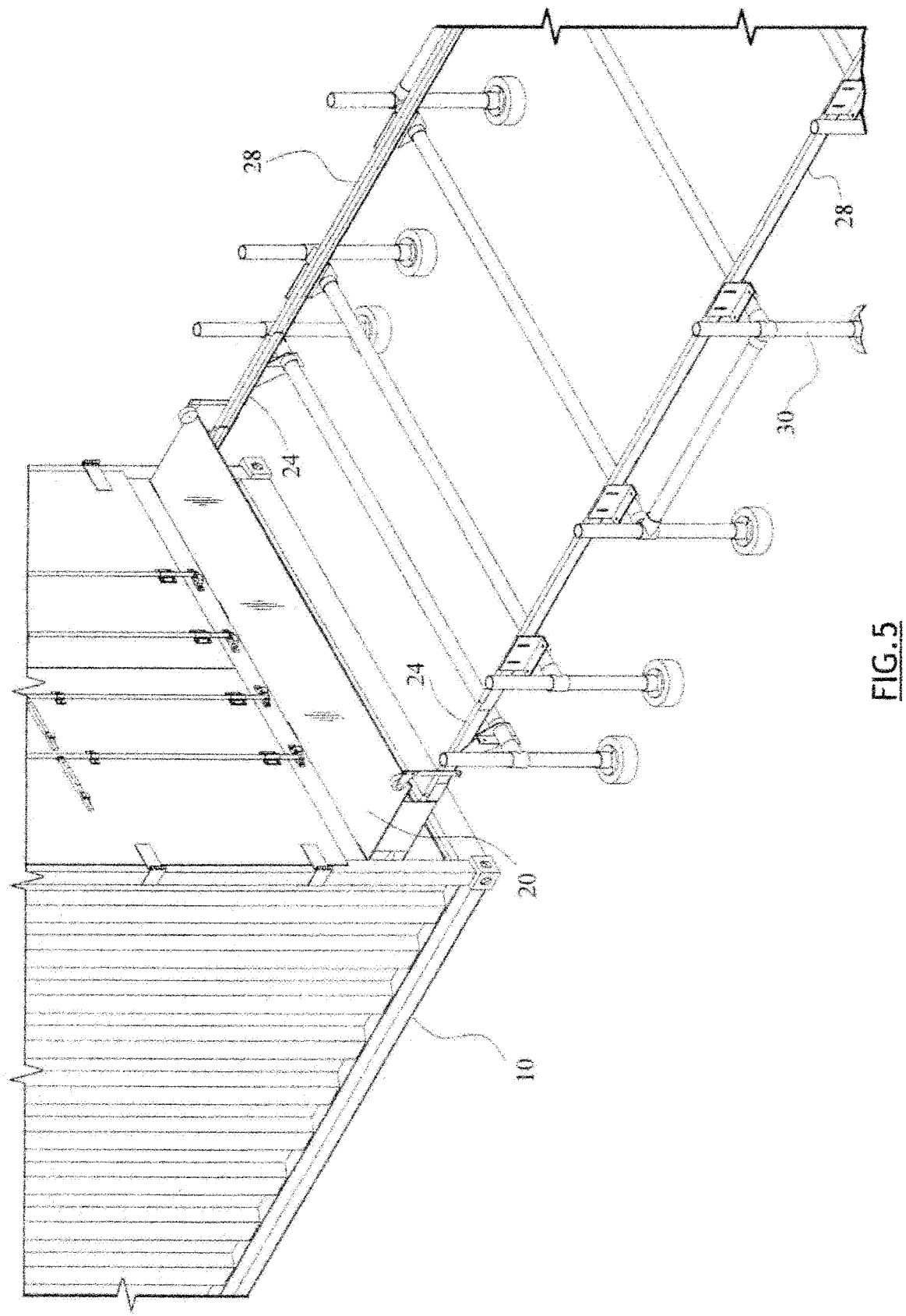
FIG. 5 is a partial isometric view thereof, here showing the modular storage structure, e.g., a steel storage container or housing with the deployment door opened, external track, a rotating external track bridge (engaged) and adjustable, modular support posts/brackets.

FIG. 4 is a partial isometric view of the modular storage structure, here a steel storage container or housing 10, with the deployment door 20 closed, and the bridge track sections 24 disengaged with the external tracks 28. This view also shows the bridge track sections 24 as mounted on the adjustable support posts 26 and the external tracks 28 on their associated adjustable support brackets 30. FIG. 5 is an isometric view as in FIG. 4 but with the deployment door 20 opened and the external bridge track sections 24 engaged.

Figure 6:
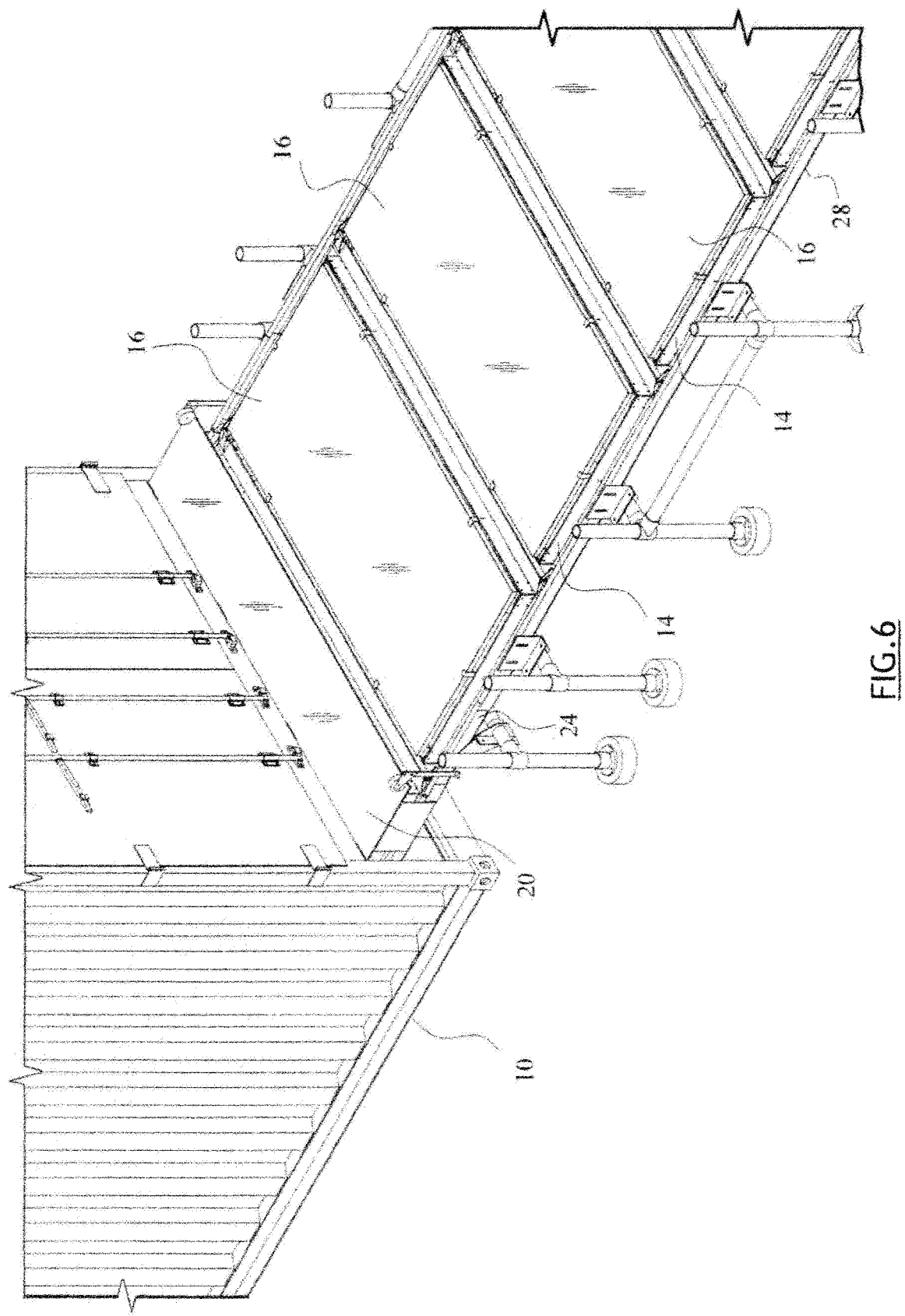
FIG. 6 is another partial isometric view thereof, here showing the modular storage structure, e.g., a steel storage container or housing with the deployment door opened, external track, a rotating external track bridge (engaged) and adjustable, modular support posts/brackets with partially-deployed wheeled support frames/fitted solar panels.

FIG. 6 is another isometric view from the same aspect as FIGS. 4 and 5, but showing the wheeled support frames 14 and their respective fitted solar panels 16 while the same are being deployed outward from the storage container 10 onto the external tracks 28.

Figure 7:
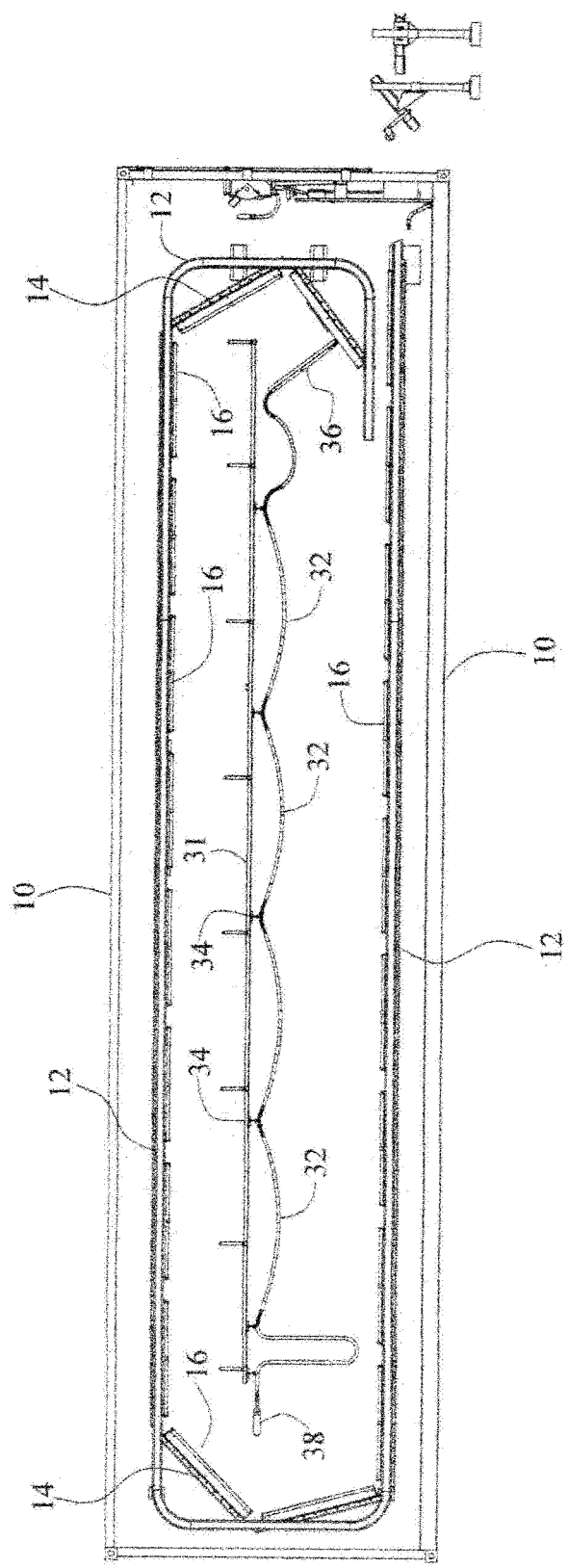
FIG. 7 is a side-view of one embodiment of the modular storage structure, e.g., a steel storage container or housing, here cut away to reveal a trolley/festoon system with attached moveable power wire, wheeled support frames/ fitted solar panels in the retracted position, internal and external track sections, adjustable support posts and brackets, also partly cut away.
Figure 8:
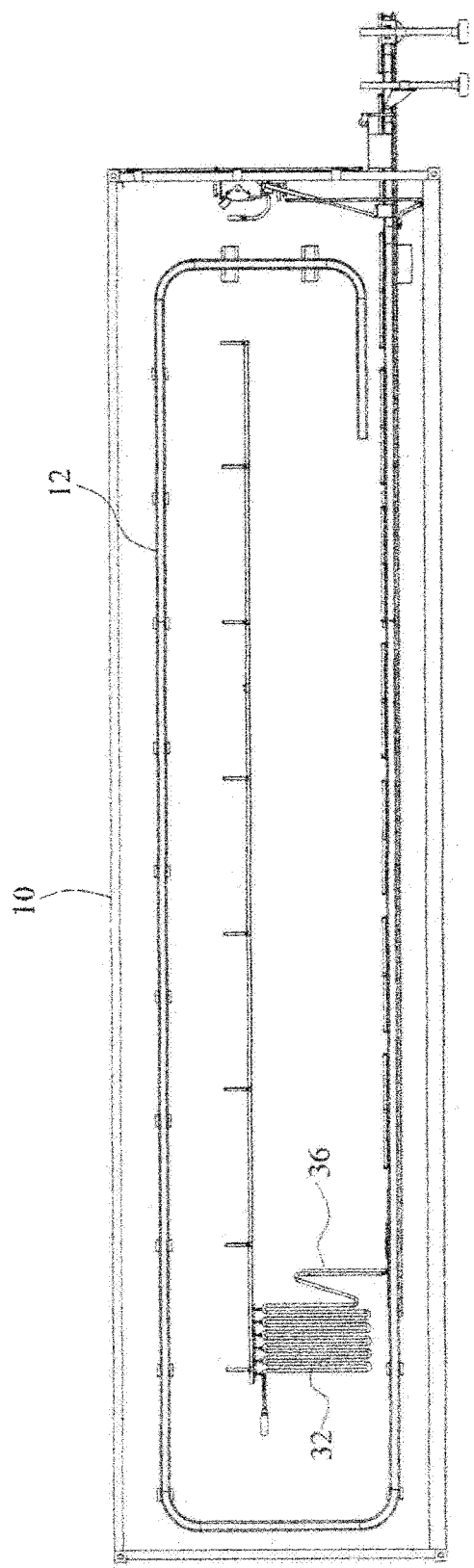
FIG. 8 is another side-view of the modular storage structure, e.g., a steel storage container or housing, here cut away to reveal a trolley/festoon system with attached moveable power wire, wheeled support frames/fitted solar panels in the partially deployed position.
Figure 9:
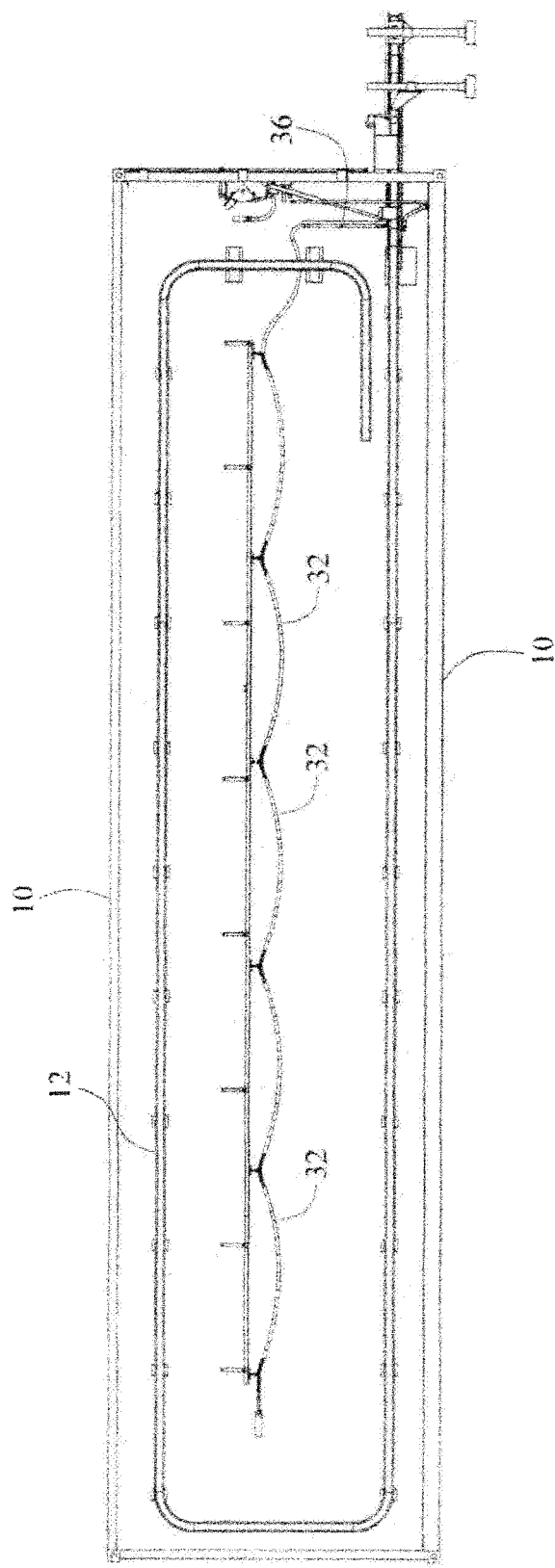
FIG. 9 is a further side-view of the modular storage structure, e.g., a steel storage container or housing, here cut away to reveal a trolley/festoon system with attached moveable power wire, wheeled support frames/fitted solar panels in their fully deployed position.

FIGS. 7, 8, and 9 are side views of the container 10 or housing, here with the modular storage structure, e.g., a steel storage container or housing, and with a side cut away, to show an internal festoon-trolley power cable or wiring system. A festoon track-way or trolley-way 31 extends withing the rails of the track 12 within the container 10 and connected to a moveable power collection wire 32 for transmitting collected power from the wheeled support frames 14 to which the solar panels 16 are fitted. FIG. 7 shows the support frames 14 and solar panels 16 in their fully retracted position within the container 10. The cable or collection wire 32 is suspended from trolley members 34 that can travel along the trolley-way 31, and there is a rigid connector rod 36 at one end connected to the most rearward of the solar panels, and an interior connector 38 at the other end that connects with power condition control and to batteries (not shown here) or other storage. FIG. 8 is shows the internal festoon-trolley system when it is positioned all together at one end of the trolley-way 31 at the mid-point of deployment of the wheeled support frames 14 and solar panels 16. FIG. 9 is shows the internal festoon-trolley system as positioned at full deployment of the wheeled support frames 14 and solar panels 16 with all but the rearmost panel being outside the container or housing 10 and on the exterior track 28.

Figure 10:
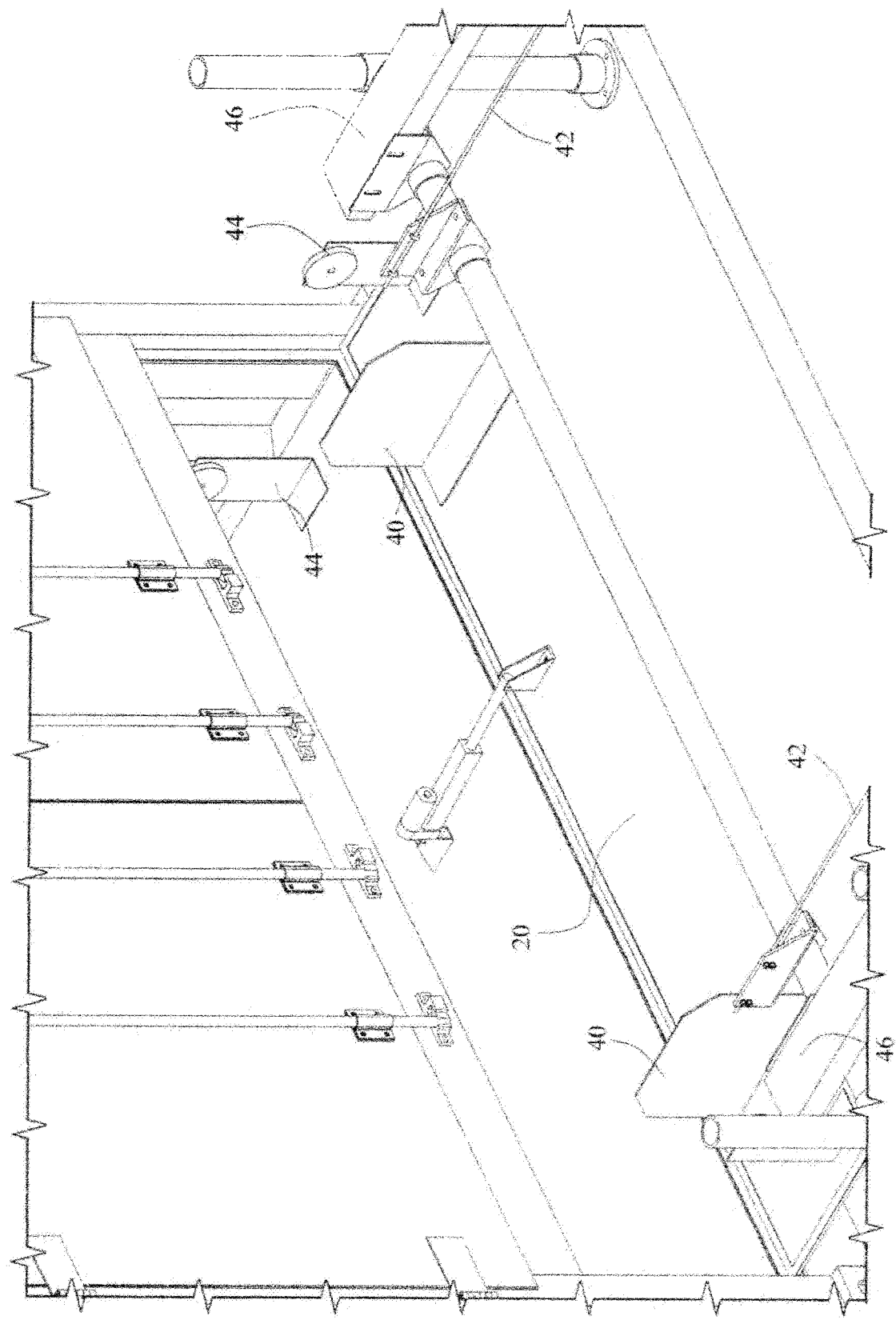
FIG. 10 is a partial isometric view of an alternate deployment system that utilizes taut cable or metal rods, wheeled rollers/brackets, an actuation bracket and formed flat sections affixed to adjustable support posts with adjustable brackets, partially cut away.
Figure 11:
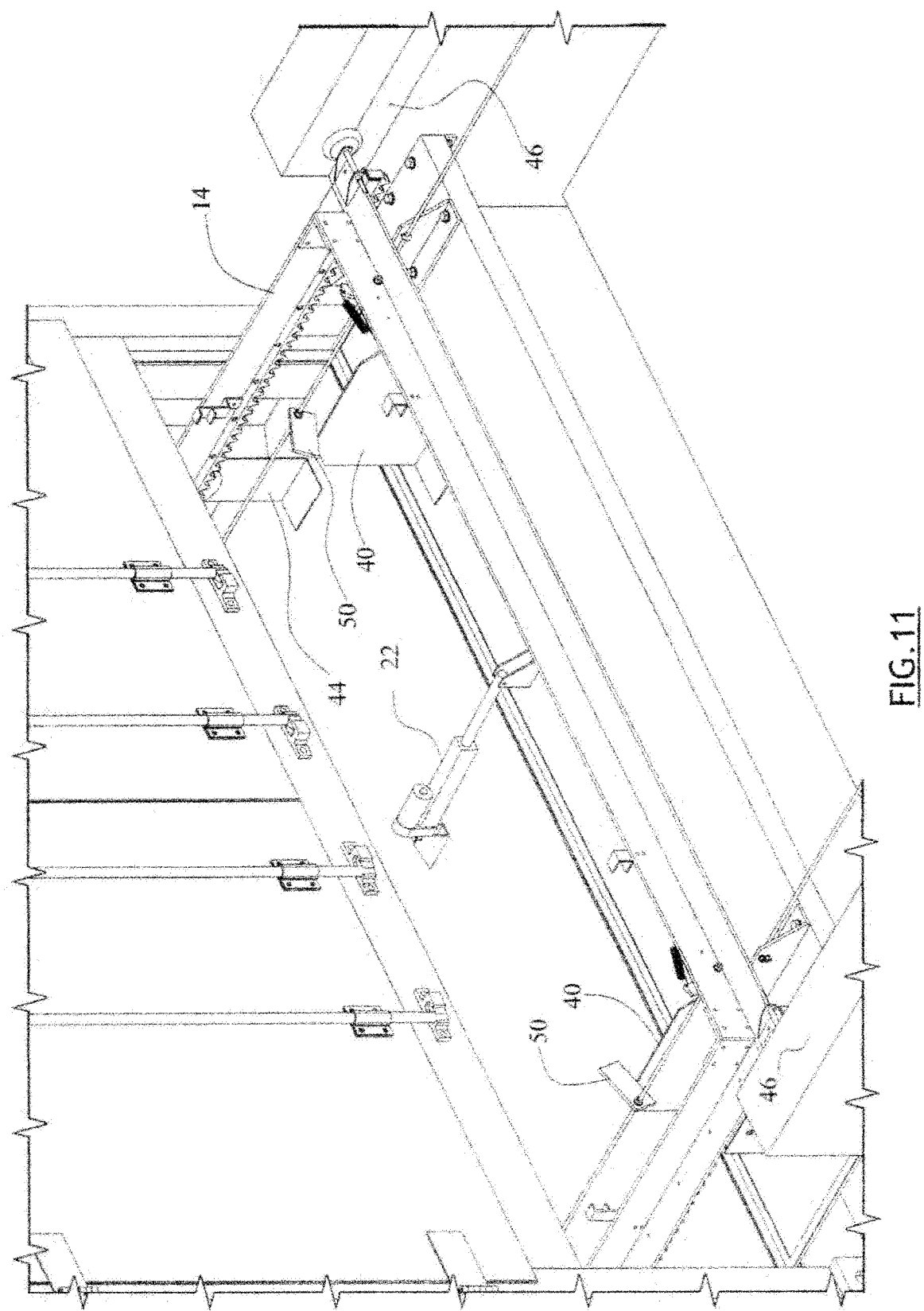
FIG. 11 is a partial isometric view of a variant of the embodiment of FIG. 10, here with a wheeled support frame (solar panel omitted) to reveal the actuation lever thereof in contact with the actuation bracket while in the process of being deployed onto a formed flat concrete surface with an included raised edge profile used for wind-shielding.
Figure 12:
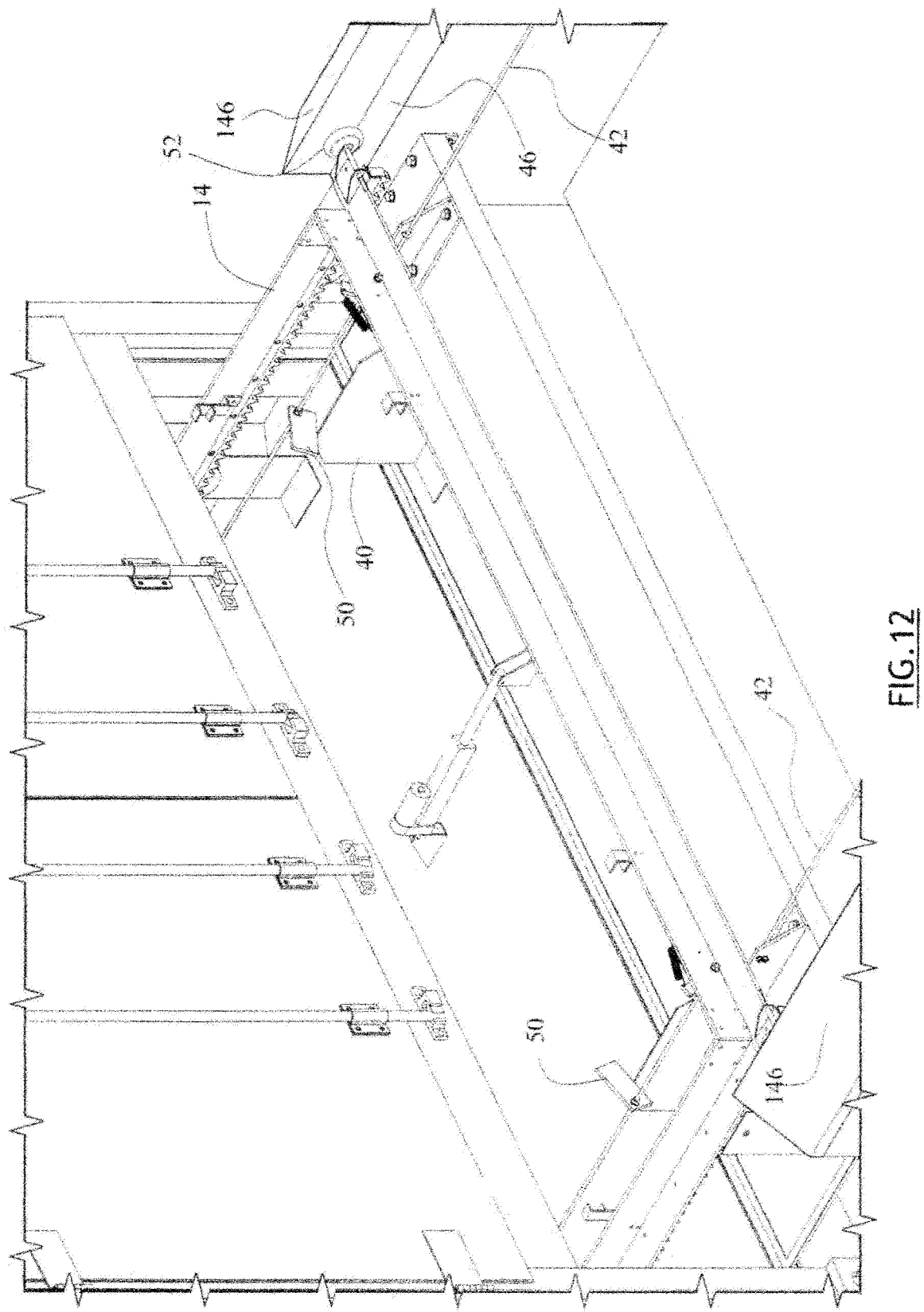
FIG. 12 is a partial isometric view of another variant thereof, here with a wheeled support frame (solar panel omitted) to reveal the actuation lever in contact with the actuation bracket while in the process of being deployed onto a formed flat concrete surface with a raised, formed-metal edge profile used for wind-shielding.
Figure 13:
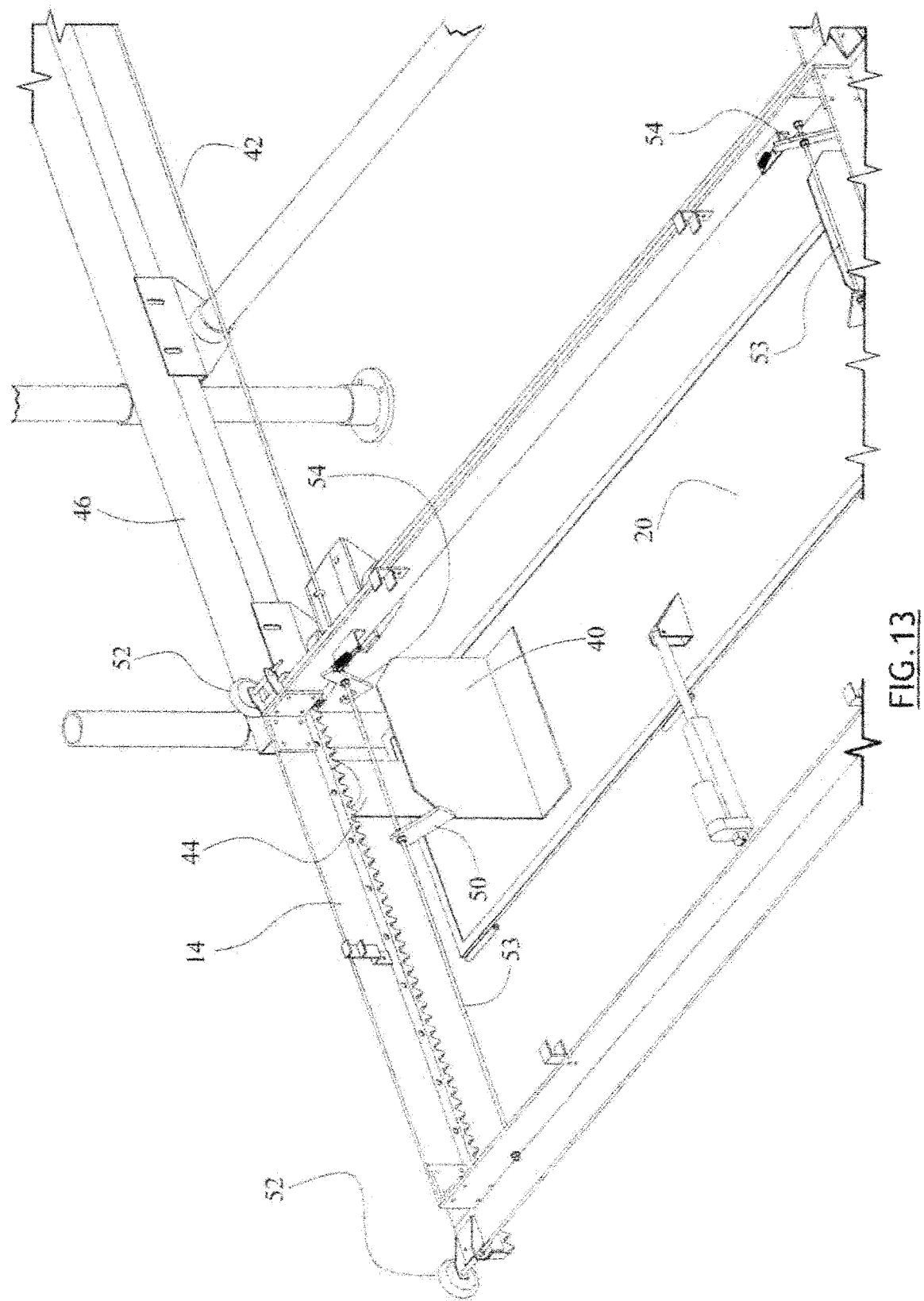
FIG. 13 is a partial isometric view of this embodiment of the invention that shows a wheeled support frame (solar panel omitted) being deployed from the steel housing (not shown), and with its actuation lever at the point of contact with an actuation bracket just prior to causing the connection hook (or roller/pulley) to rotate for connection to the taut cable and/or metal rods.

FIGS. 10 to 13 illustrate a variant or alternative embodiment where the support frames and panels are guided along taut guide wires or rods. FIG. 10 is a partial isometric view that the forward end of the container or housing 10 in an alternative, non-tracked deployment system which uses guide wires or rigid rods to guide the series of wheeled support frames 14 and panels 16 along steel (or concrete) ribbon platforms; in this embodiment, roller brackets 44 replace the internal moveable track section 18. In FIGS. 11 and 12, the first support frame 14 (PV panel 16 is omitted in this view) beginning to emerge via the deployment door 20; FIG. 11 and FIG. 12 differ in the structure of the horizontal flat strips that provide rolling surfaces for the wheels 52 of the support frames 14. FIG. 13 is an enlargement showing cam action of a cam-follower actuating lever 50 and connection hook 54 that make a sliding attachment to the guide wires 42.

A pair of steel guide wires 42, 42 are attached to the frame of the exterior track or exterior flat rolling surfaces beyond the deployment door 20. There are roller brackets 44 that carry the support frames out to the rolling surfaces 46, and on the back of the deployment door 20 are a pair of actuator cam brackets 40, 40 each with a front sloping cam surface, a top flat surface, and a second sloping cam surface. Each wheeled support frame 14 carries two camming arrangements, each with a cam lever 50 that rides along the cam surfaces of the respective actuator bracket 40, and an associated connection hook 54, with the cam lever 50 and connection hook 54 being joined by a rotatable linkage rod 53. There is a return spring also, biasing the connection hook 54 to the un-rotated position.

Figure 14:
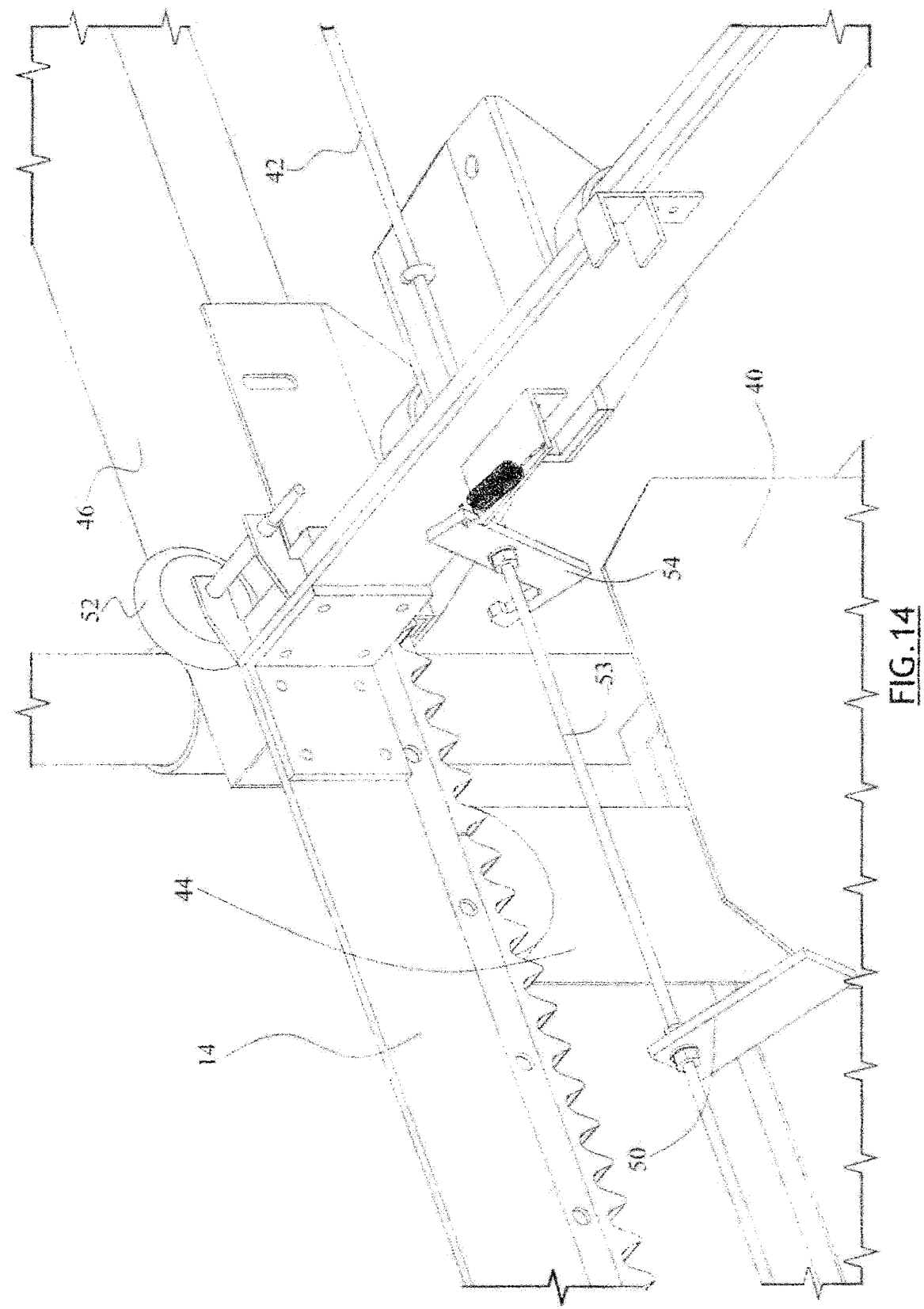
FIG. 14 is an enlarged partial isometric view, showing a wheeled support frame (solar panel omitted) being deployed from the steel housing (not shown).
Figure 15:
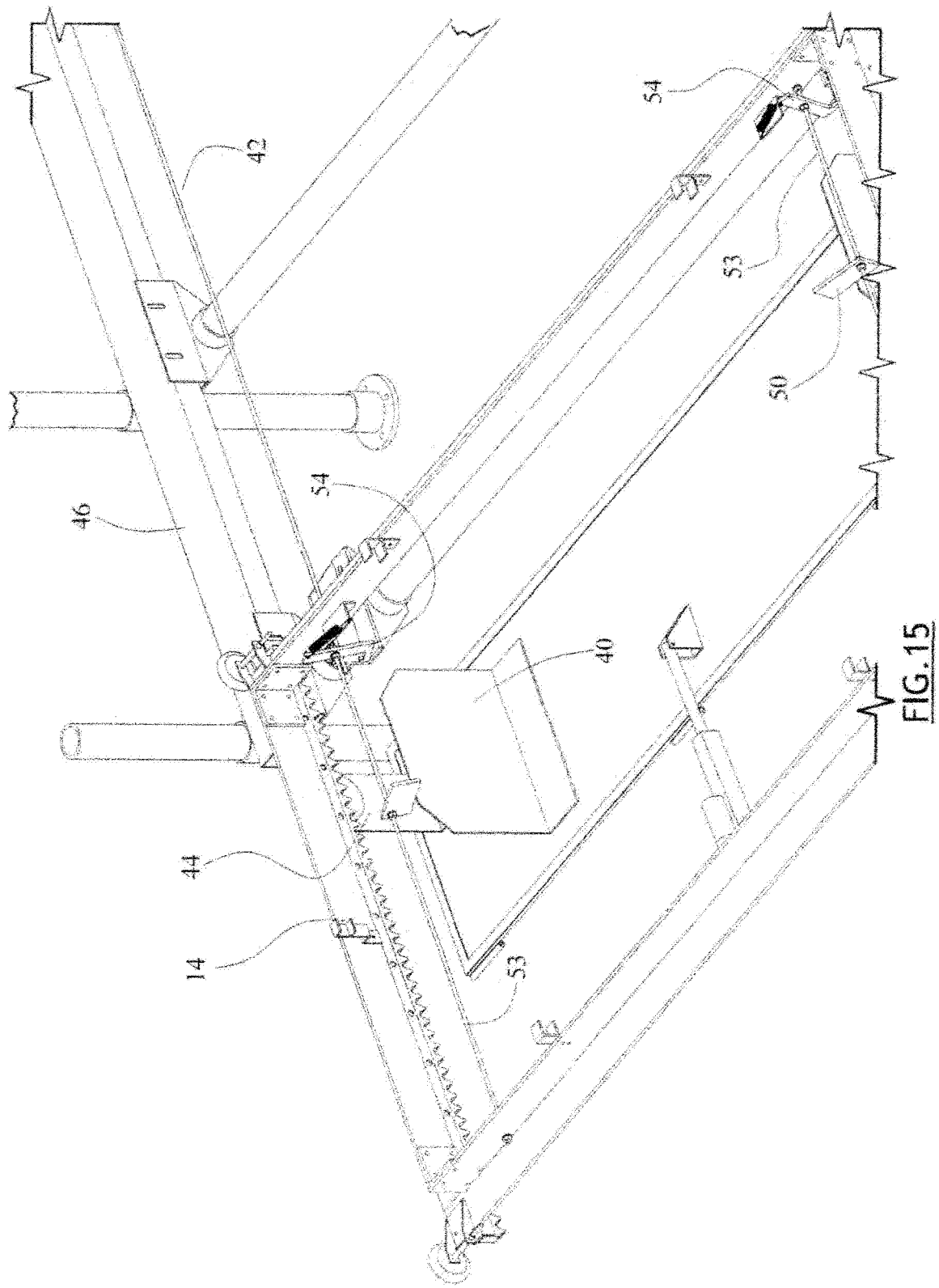
FIG. 15 is another partial isometric view thereof, showing a wheeled support frame (with solar panel omitted) being deployed from the steel housing (not shown), where an actuation lever is in full contact with the actuation bracket causing full rotation of the connection hook (or roller/ pulley) just prior to making connection to said taut cable and/or metal rods.
Figure 16:
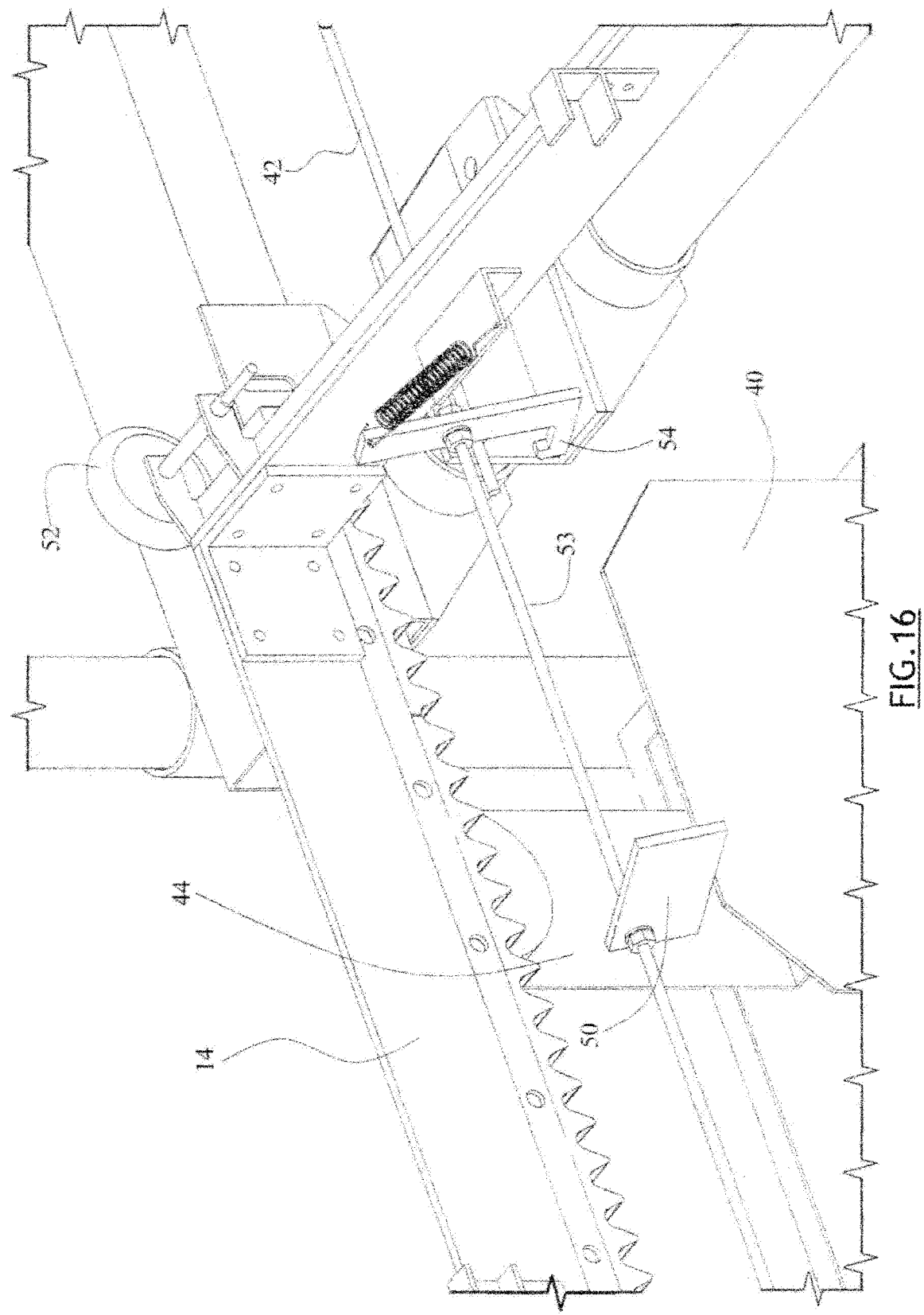
FIG. 16 is an enlarged partial isometric view thereof.

Upon deployment, bracket-mounted rollers 44 carry the wheeled support frames 14 and solar panels 16 of the modular storage structure onto formed flat rolling surfaces 46, where the support frames are guided in a straight path by latching of the hooks 54 onto the guide wires 42 (or metal rods). At the point of the cam lever 50 contacting the actuation bracket 40, the lever 50 and associated connection hook 54 have not yet rotated (See FIG. 14). Then, at the position shown in FIG. 15, the actuation lever 50 has begun to engage the actuation bracket 40 and the connection hook has begun to rotate. At the position shown in FIG. 16, the connection hook 54 has fully rotated prior to engaging the wire or cable 42. When the support frame has moved somewhat farther along, the actuating lever 50 reaches the second cam portion of the actuator bracket 40, and the hook(s) 54 rotates back to engage the guide wire(s) or cable(s) 42. This occurs for each support frame 14 in succession so all are held in position laterally and vertically on the two guide wires or cables.

Figure 17:
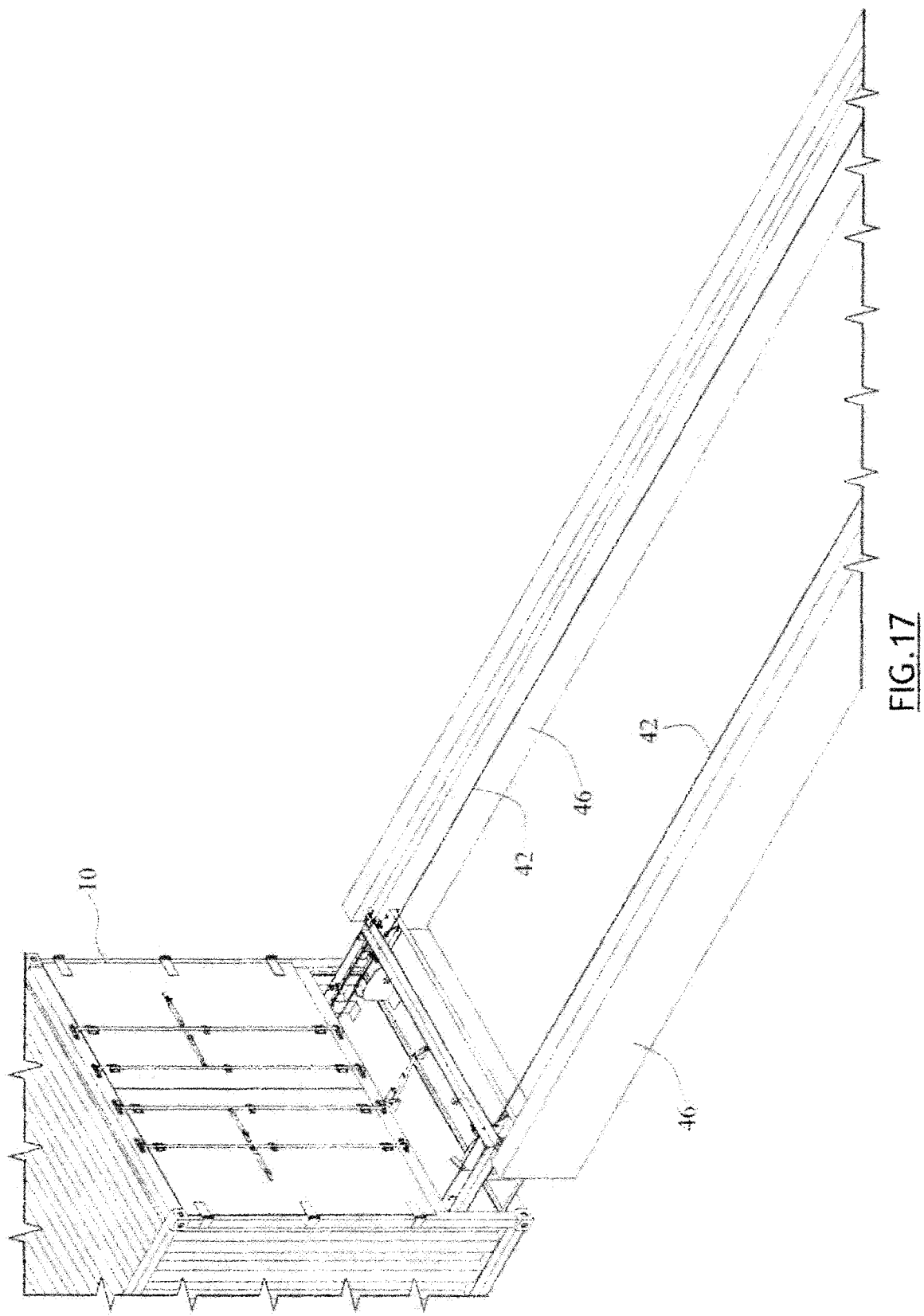
FIG. 17 is a partial isometric view of the modular storage structure, e.g., a steel storage container or housing with its deployment door open, a wheeled support frame (solar panel omitted) being deployed, and formed flat concrete support surfaces with a formed, raised edge profile used for wind-shielding and taut cable and/or metal rods.
Figure 18:
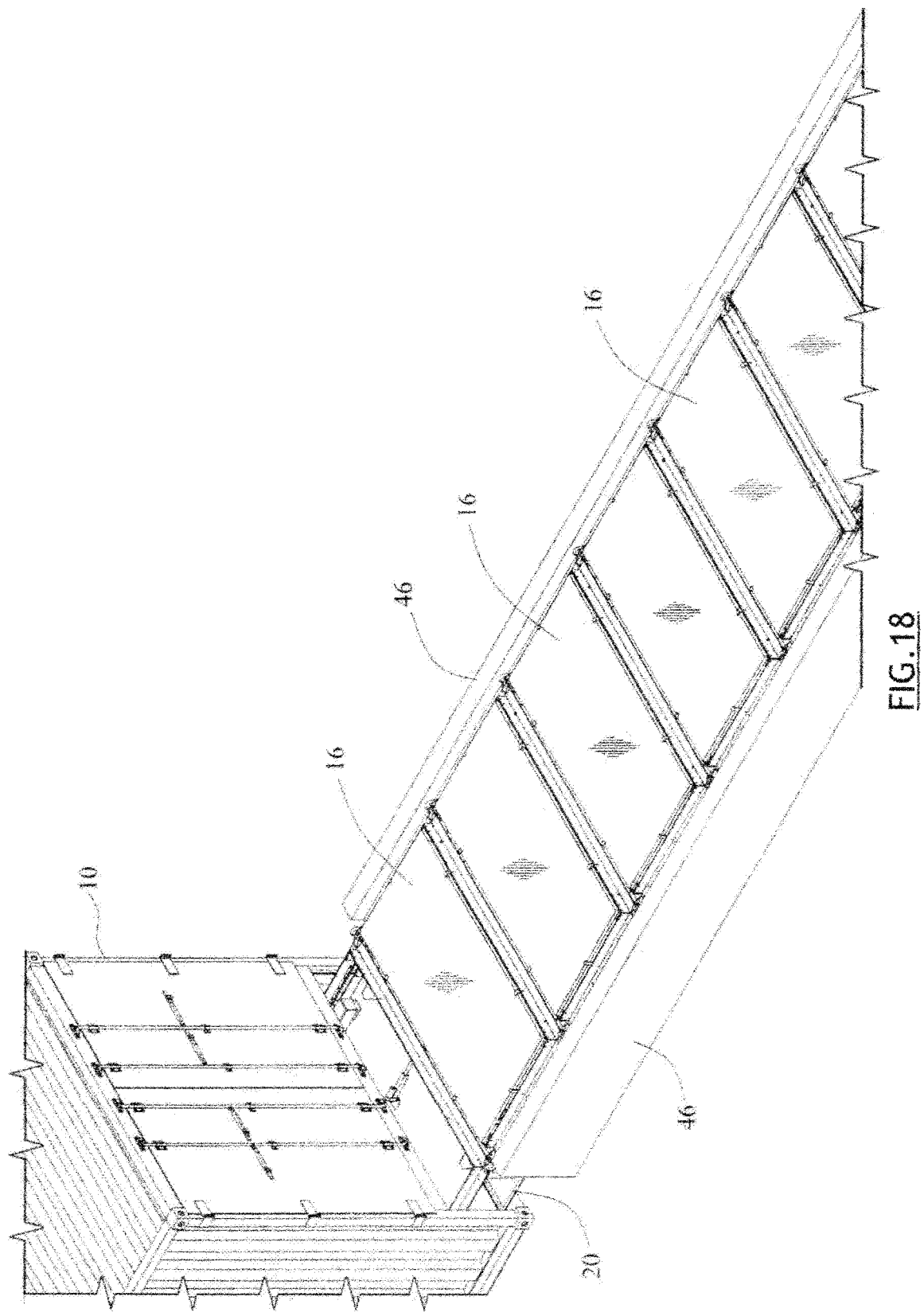
FIG. 18 is another partial isometric view thereof, here showing wheeled support frames with fitted solar panels, in fully deployed condition.
Figure 19:
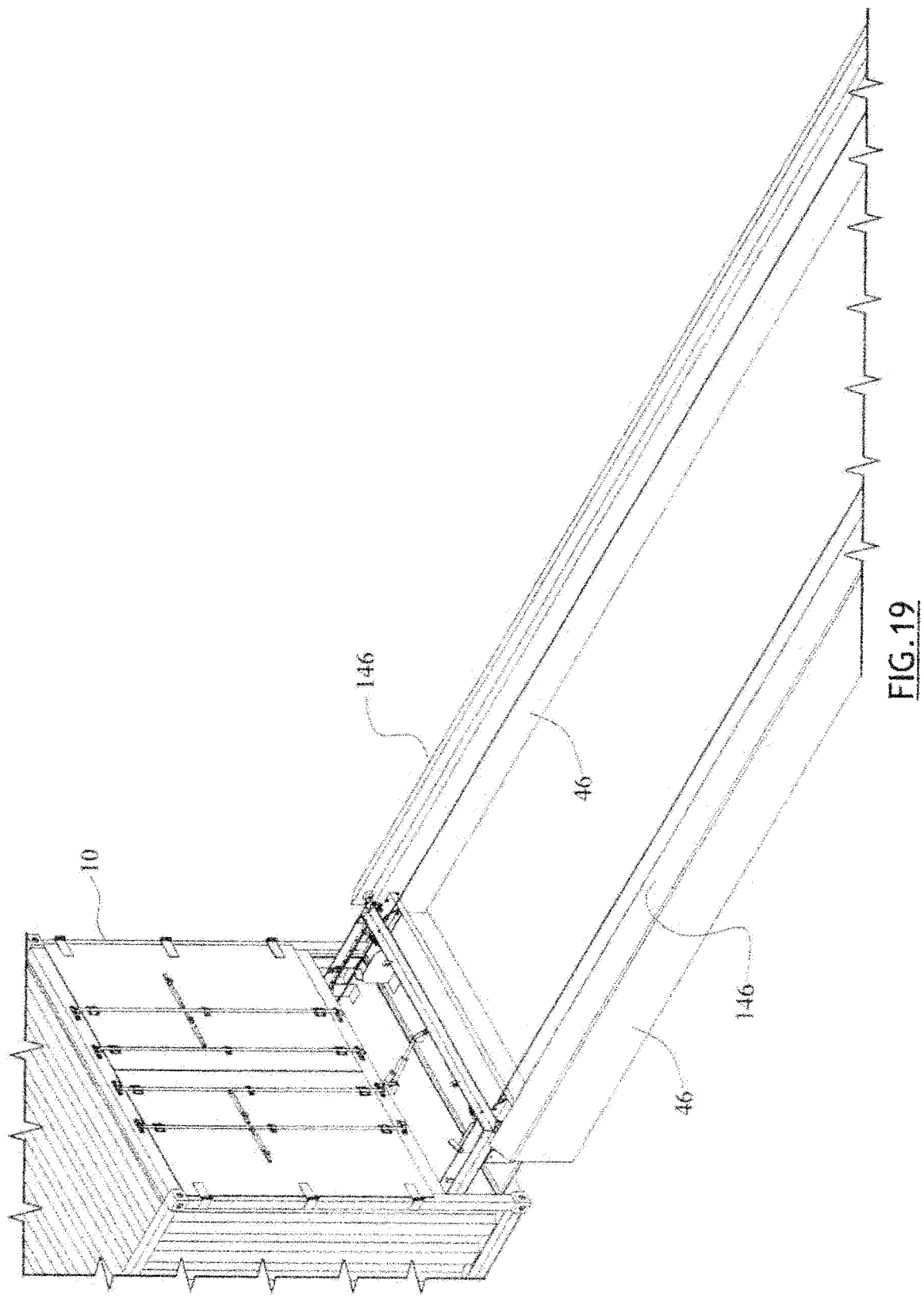
FIG. 19 is a partial isometric view thereof, in the retracted or redeployed condition.
Figure 20:
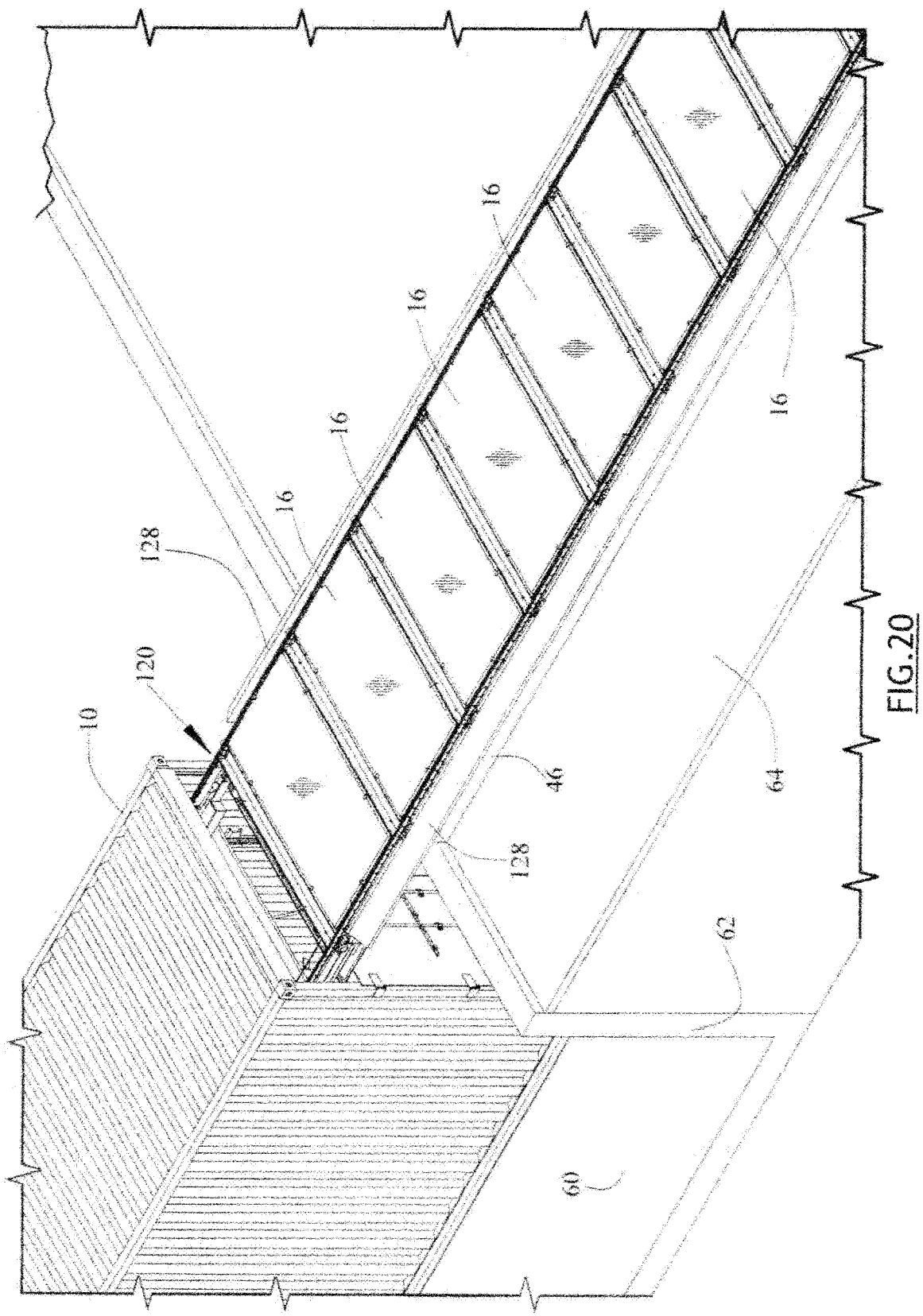
FIG. 20 is a partial isometric view showing a modular storage structure according to another embodiment, e.g., a steel storage container or housing, which is recessed below the surrounding land or ground surface(s) and utilizing a top deployment door.

FIG. 17 is an isometric view showing the modular storage structure, i.e., container or housing 10, where the support surfaces 46 for the wheels 52 are comprised of formed concrete footers with a raised edge portion 146 that creates a wind-shielding profile. FIG. 18 is another partial isometric view thereof, here shown with fully extended wheeled support frames fitted with their respective solar panels 16, and with one of the support surfaces 46 being formed at one edge 246 of a concrete pad. FIG. 19 is another partial isometric view, similar to FIG. 17, but here with the flat rolling surfaces formed as flat concrete footers and with formed metal edges 146 as wind-shielding profiles. FIG. 20 illustrates another embodiment in which the modular storage structure, e.g., container or housing 10, is recessed below surrounding ground level, and with a top-located deployment door 120. Here the solar panels 16 are shown along poured concrete or formed steel rolling surface strips 128, with a slab 60 for the container 10 recessed below the ground surface 64, and with a concrete wall 62 at the forward end of the container 10.

Figure 21:
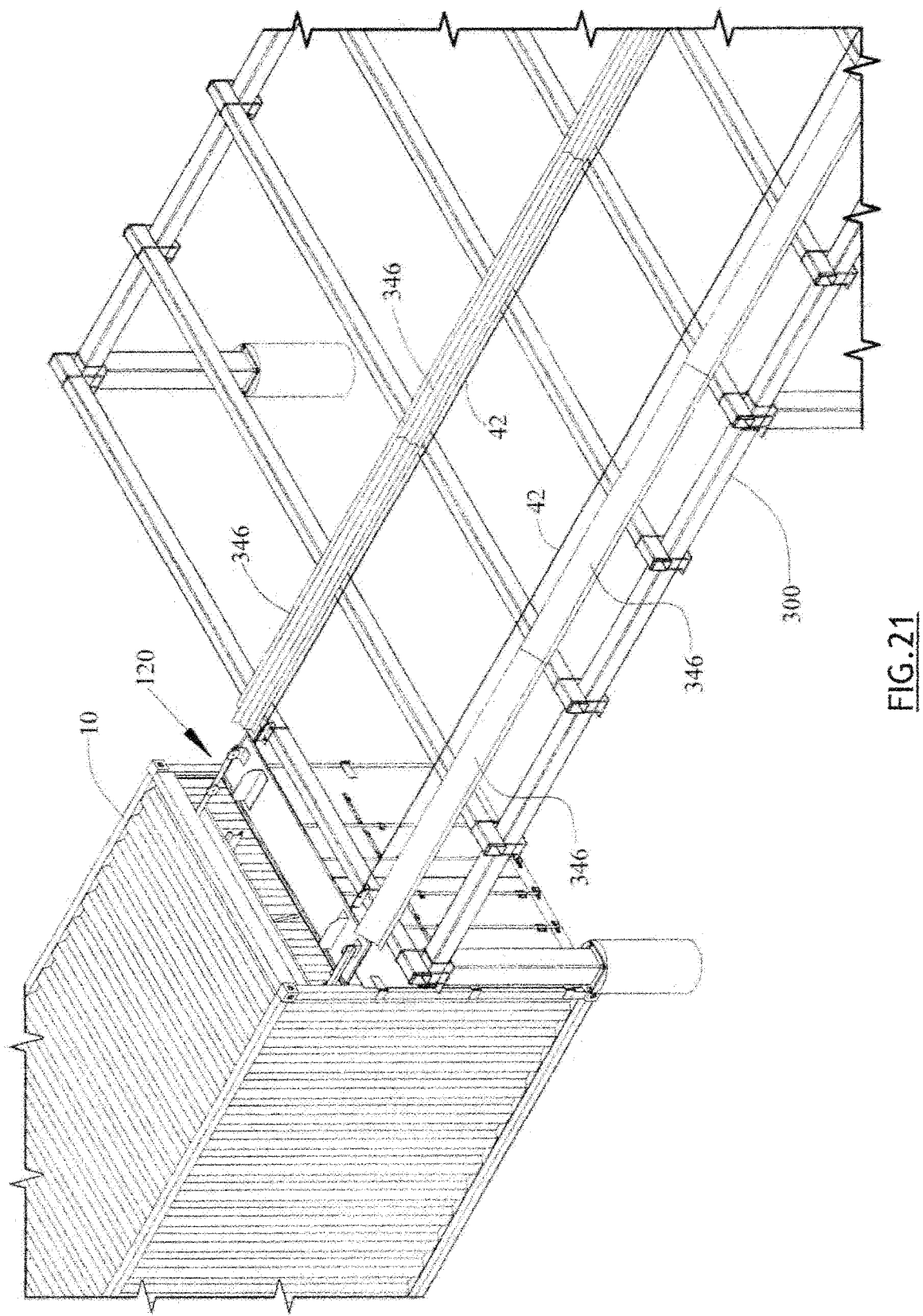
FIG. 21 is a partial isometric view of a related embodiment of the invention showing a modular storage structure, e.g., a steel storage container or housing, in a carport application with an open top deployment door with taut cable/metal rods and a formed-metal 'wind-shielding' feature.

FIG. 21 shows the modular steel storage container or housing 10, with an open, top-located deployment door 120 in the context of a car parking facility, e.g., carport application. A raised, structural steel frame 300 carries the pairs of support surfaces 346, i.e., solid ribbons, on which wheeled support frames 14 and their fitted solar panels 16 travel at an overhead level, e.g., above a parking area. The solar panels provide shade for the parked cars Electric car charging stations could be installed, if desired in this embodiment.

Figure 22:
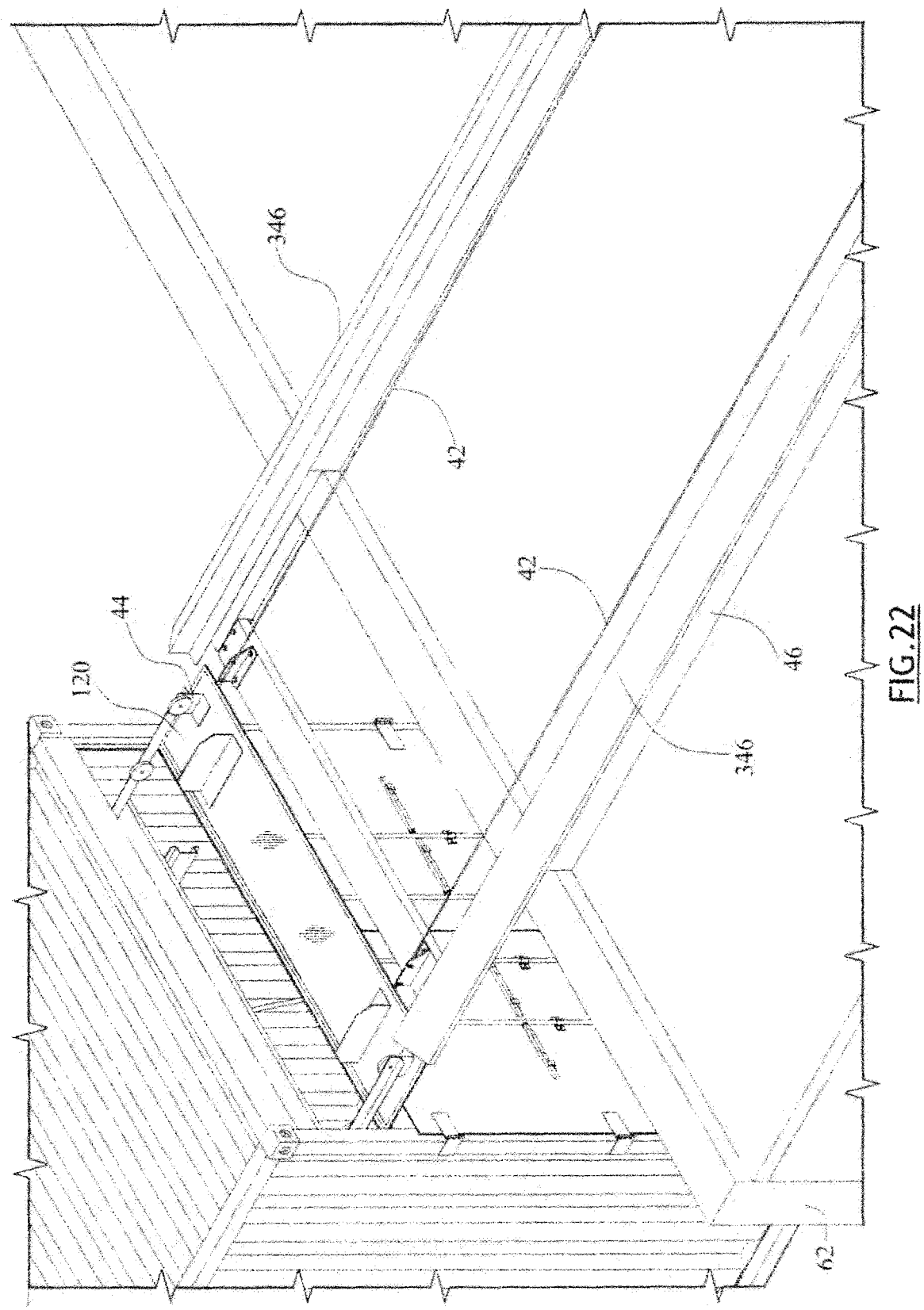
FIG. 22 is a partial isometric view of related embodiment of the invention, showing a modular storage structure, e.g., a steel storage container or housing, which is recessed below the surrounding land surfaces and utilizing a top deployment door, formed concrete footers with a raised, formed metal, 'wind-shielding' edge profile attached, and showing the taut cable or metal rods.

FIG. 22 is an isometric view of another embodiment of a modular storage structure, e.g., a steel storage container or housing 10, with an open, top-located deployment door 120 in a recessed application (set in below the grade of a flat land surface, here shown with taut guide wires or cables 42, and/or metal guide rods and formed metal 'wind-shielding' feature 346 attached to concrete footers, e.g., 46.

Figure 23:
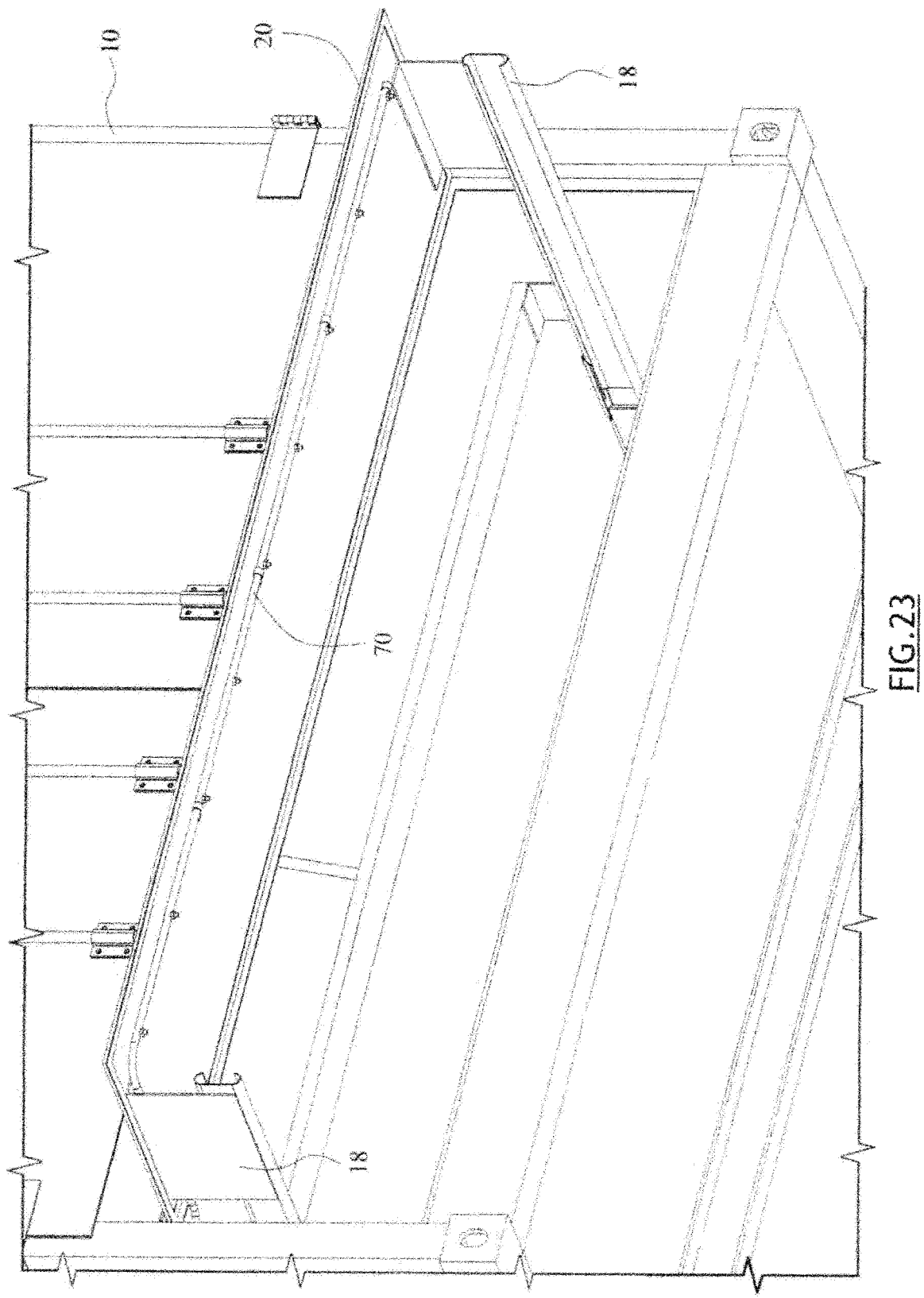
FIG. 23 is a partial isometric view, here showing the underside of the deployment door with the sprayer bar attached for cleaning the upper surface of the associated solar panels.
Figure 24:
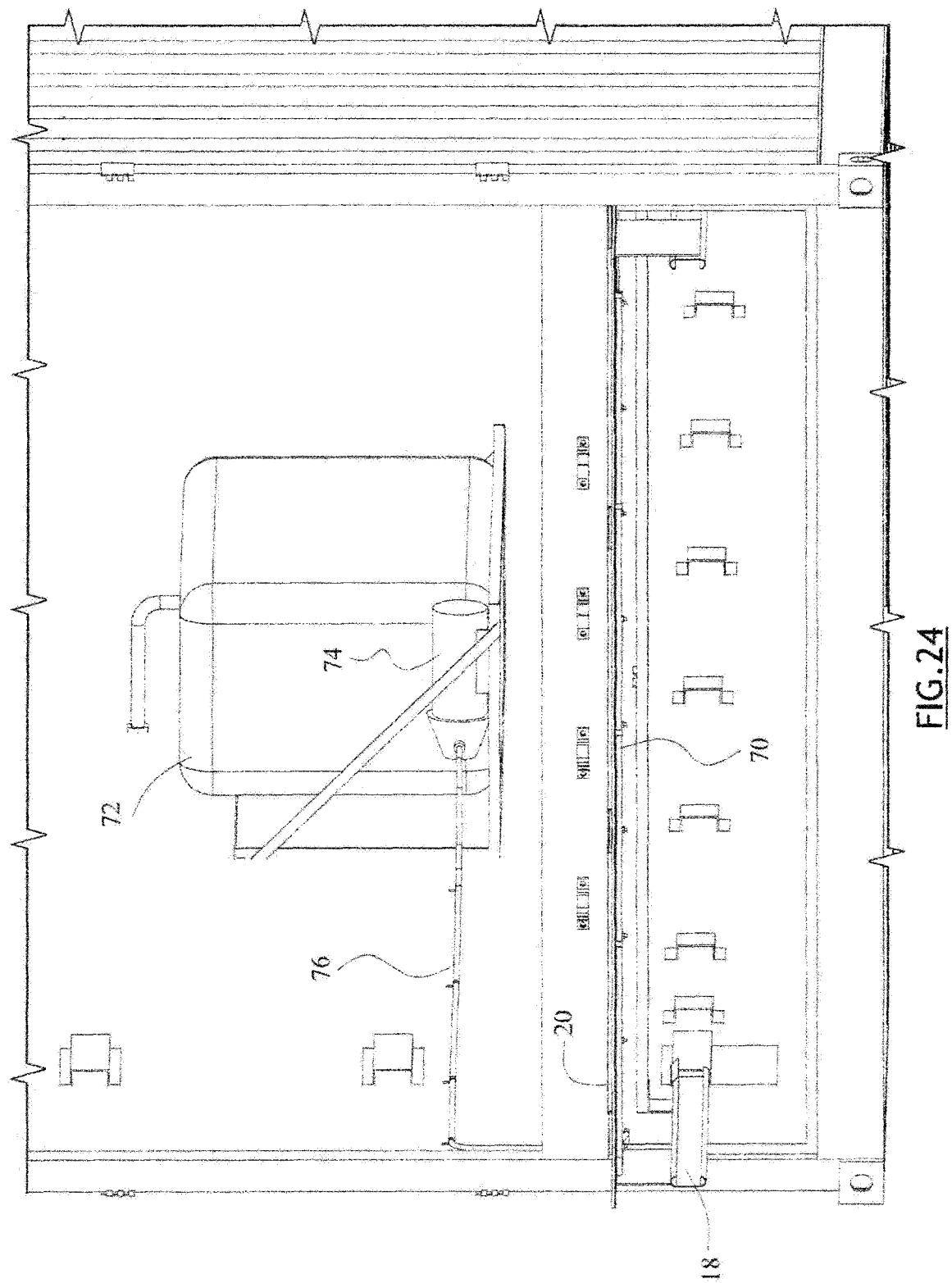
FIG. 24 is a partial isometric view, here with container doors removed showing the wash system water tank, the wash system pump, wash system tubing and the wash system sprayer bar.
Figure 25:
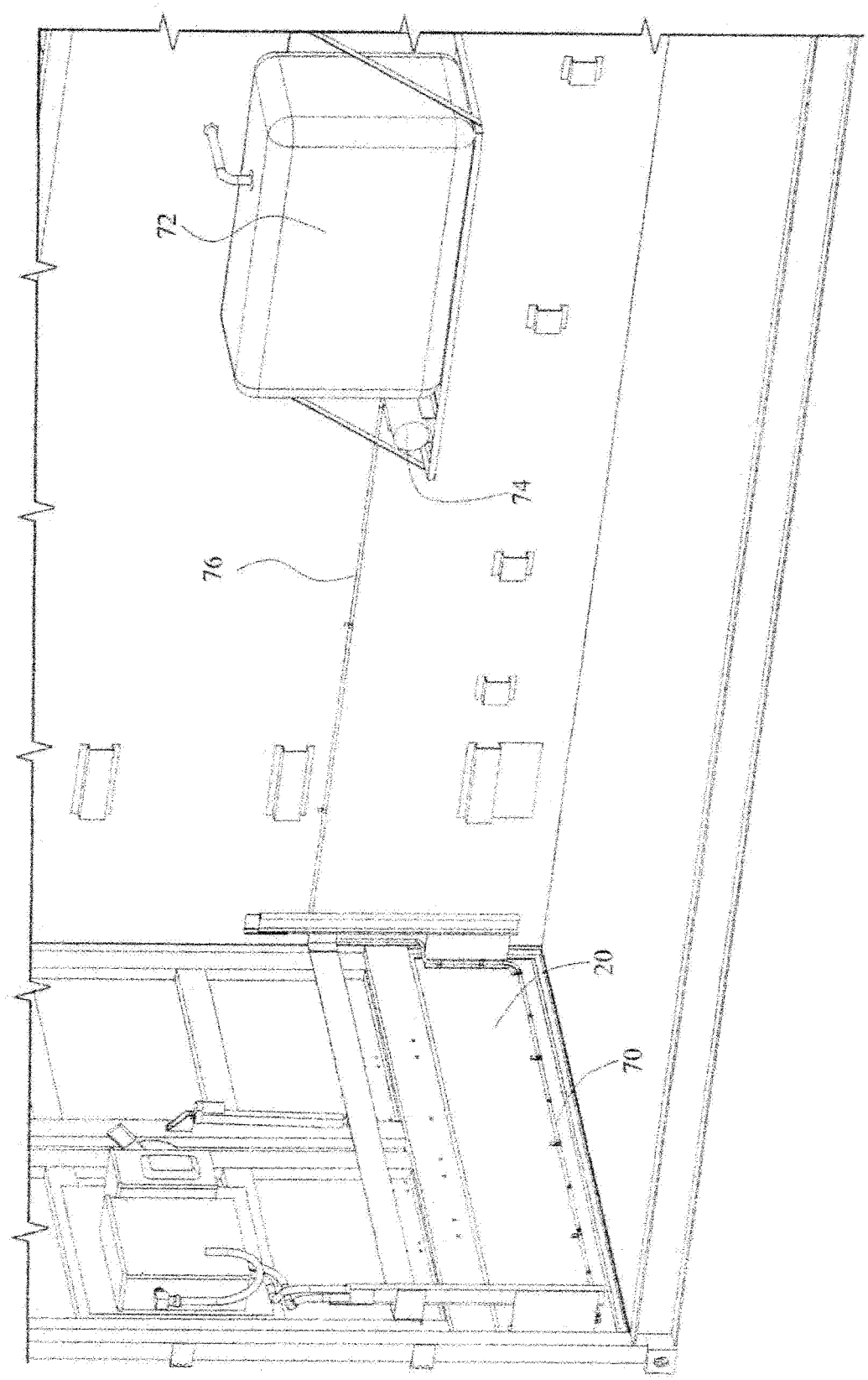
FIG. 25 is another partial isometric view, here cut away to show the internally-mounted wash system components.
Figure 26:
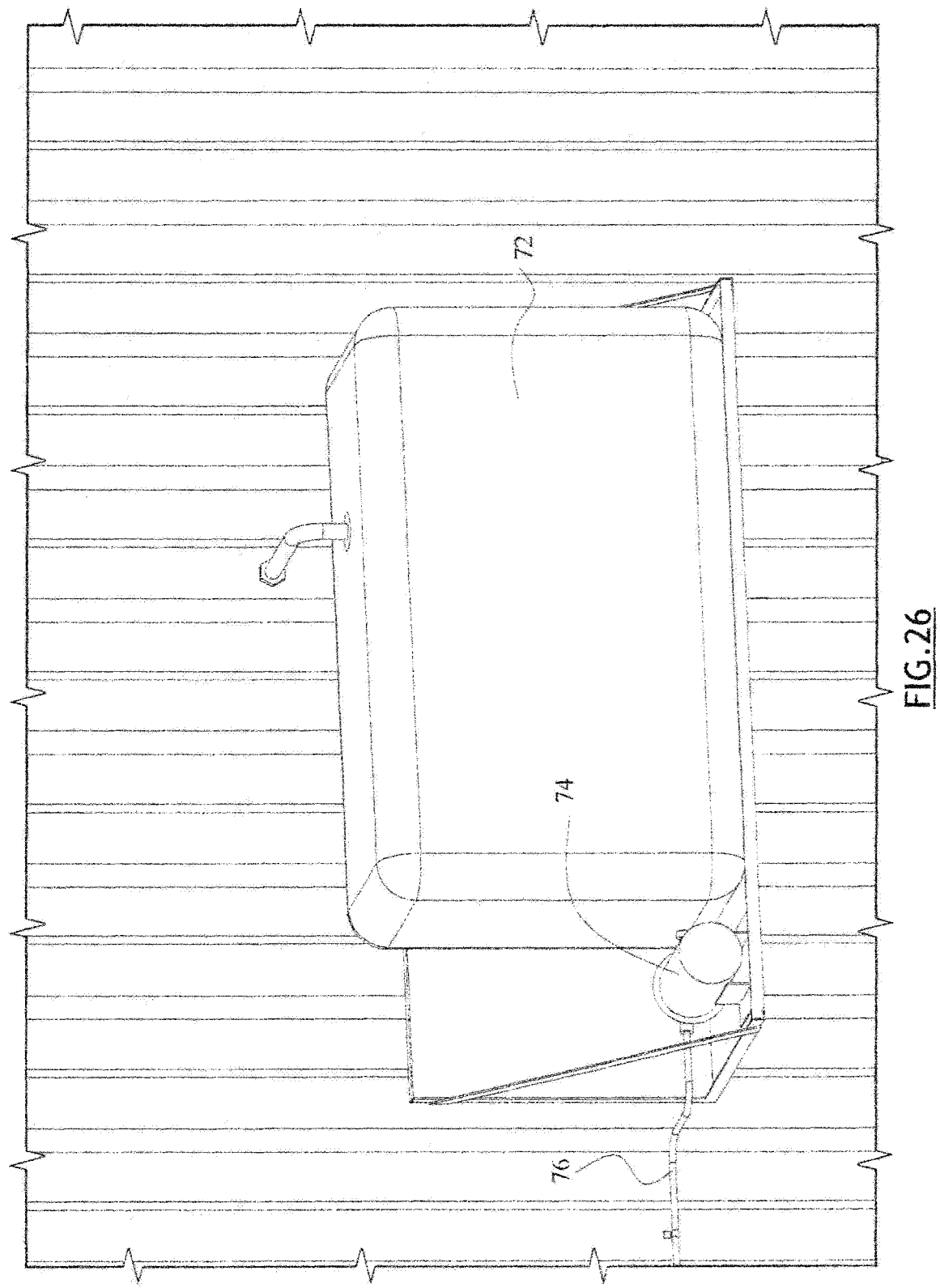
FIG. 26 is a partial isometric view, here cut away, and showing the wash system water tank, wash system pump and tubing.

FIG. 23 is a further isometric view that shows another embodiment that features an arrangement for cleaning or spray-washing the photo-voltaic panels 16. This embodiment is shown with the modular storage structure, e.g., a steel storage container or housing 10, the underside of a bottom-located, open deployment door 20 with a wash system sprayer bar 70 attached, and extending across the width of the deployment door. This arrangement is configured so as to spray the panels 16 as they are deployed out and/or re-deployed back into the container or housing 10. As shown in the isometric elevation of FIG. 24, the wash system that supplies the wash water or wash solution to the spray bar 70 includes a water tank 72, a wash system pump 74 attached to the tank 72 and which supplies the liquid under pressure through wash system tubing 76 that feeds the wash bar 70. The access doors of the modular storage container or housing are removed in this view as are the internal tracks 12 and wheeled support frames 14 and solar panels 16, although support brackets (not numbered) for the internal tracks mark the location of the internal tracks. The wash system tank 72, pump 74, tubing 76 and spray bar 70 are also illustrated in FIG. 25 to show their position on the inside of the container or housing 10. The tank 72 and pump 74 are shown in more detail in FIG. 26.

Figure 27:
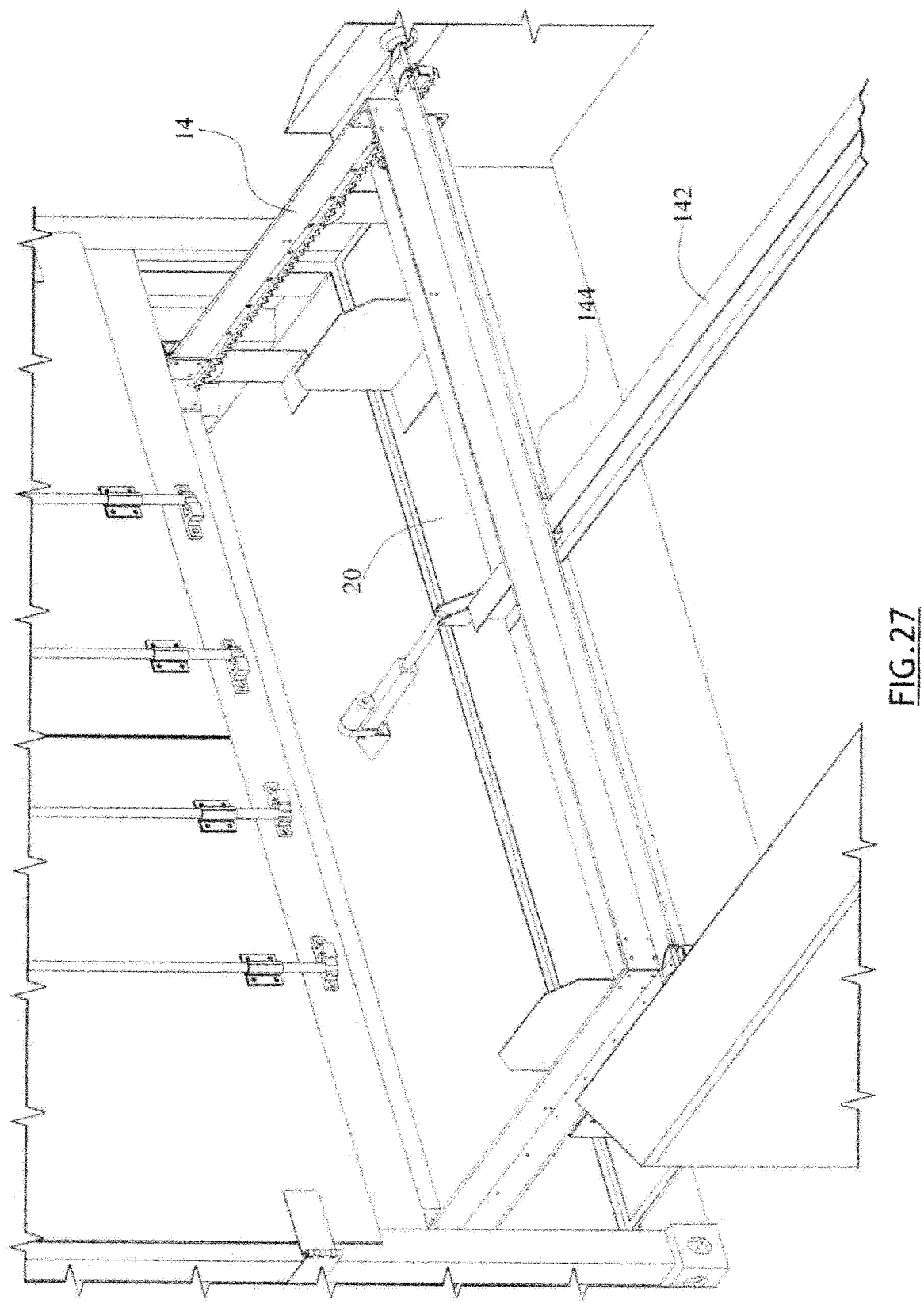
FIG. 27 is a partial isometric view showing the modular storage structure, e.g., a steel storage container or housing, with the open deployment door, a wheeled support frame (solar panel omitted) being deployed, formed flat concrete surfaces with an attached, formed, raised-edge, metal profile used for wind-shielding and an interlocking 'bar/bracket' attachment system which prevents the wheels of the wheeled support frames/solar panels from 'lifting' off of the flat surfaces.
Figure 28:
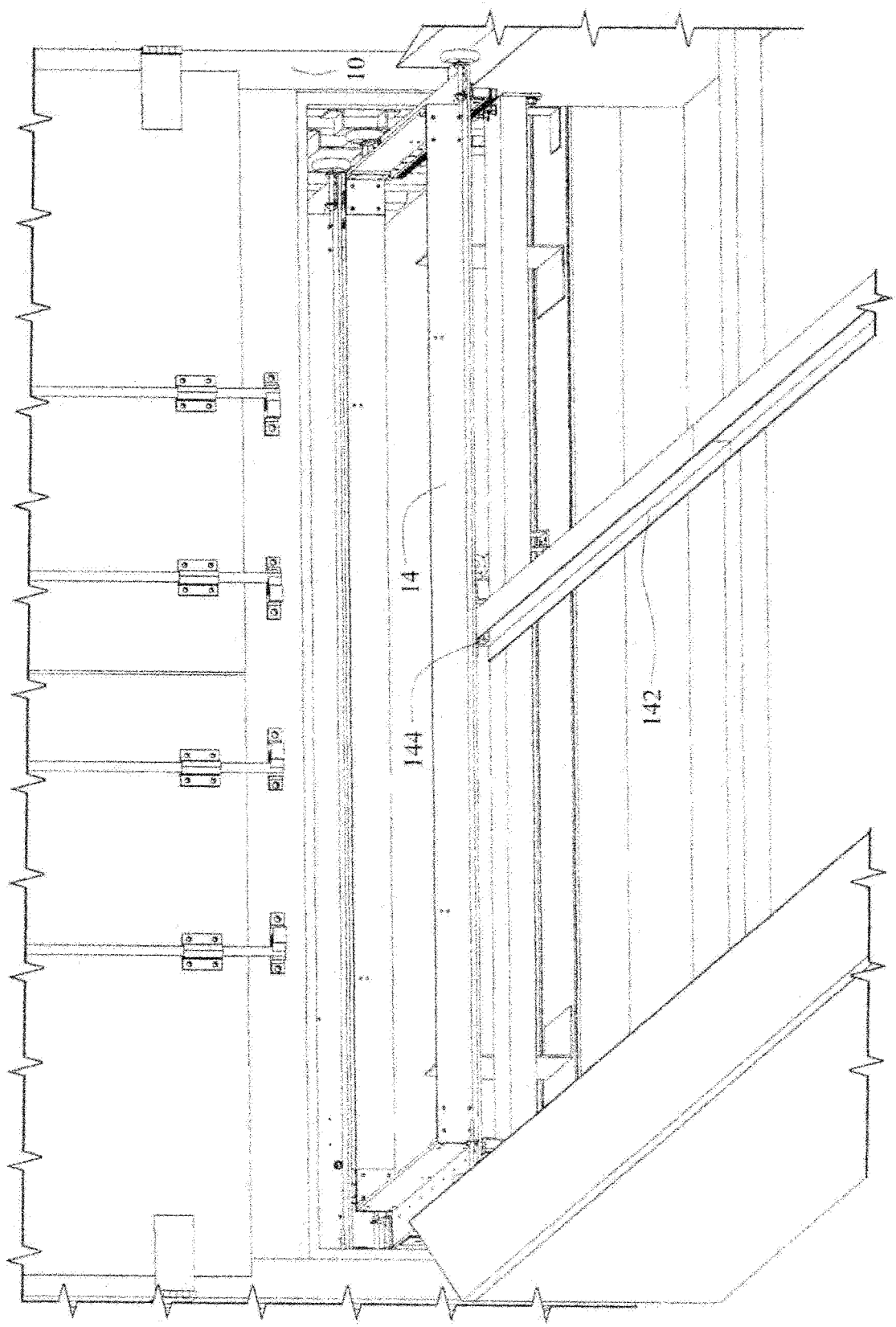
FIG. 28 is a further, partial isometric view, here showing the modular storage structure, e.g., a steel storage container or housing, with the open deployment door, a wheeled support frame (solar panel omitted) being deployed, formed concrete footers with a raised, formed metal, 'wind-shielding' edge profile attached and the interlocking 'bar/bracket' attachment system.
Figure 29:
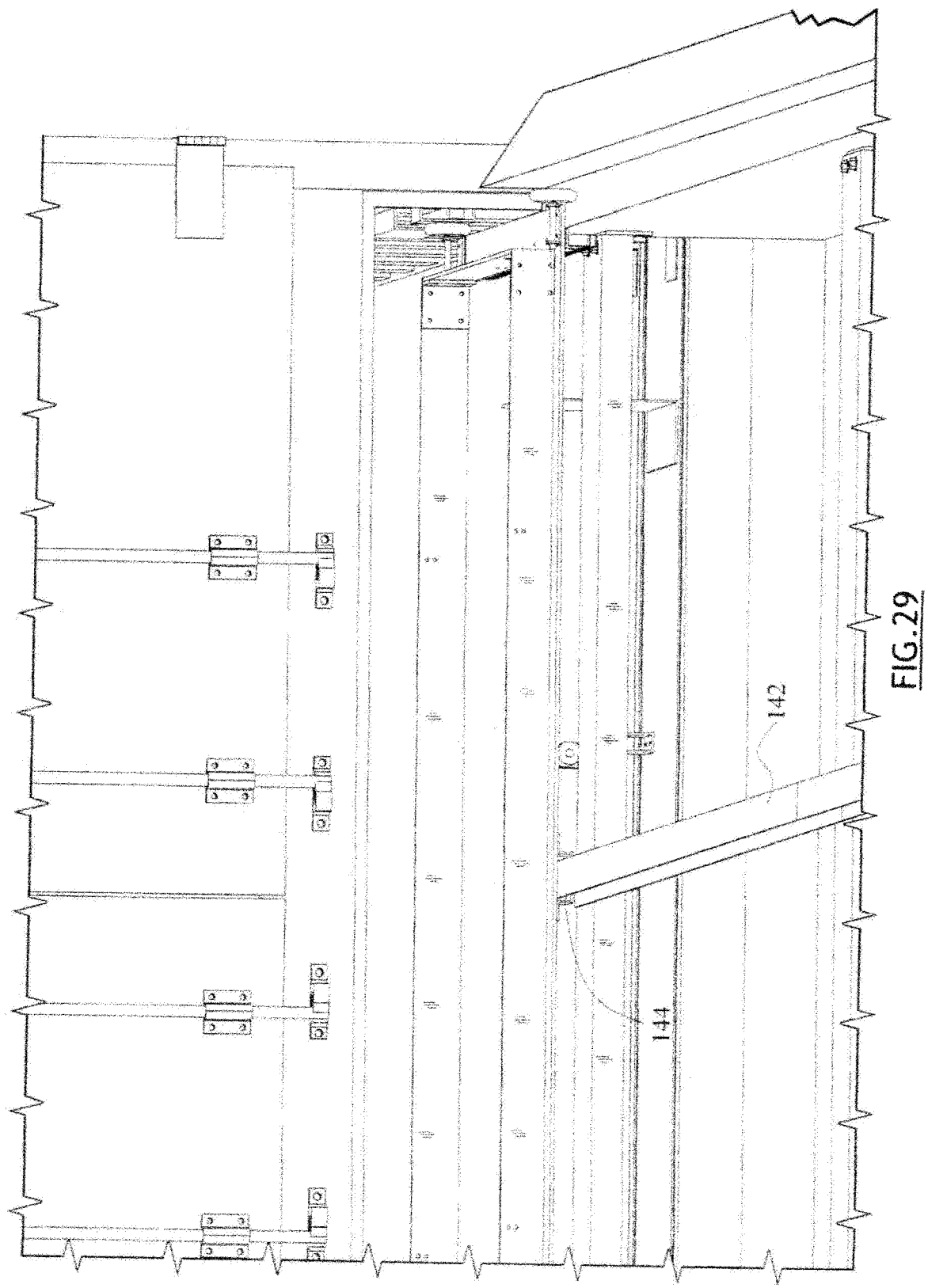
FIG. 29 is an enlarged partial isometric view, here showing the interlocking 'bar/bracket' attachment system.
Figure 30:
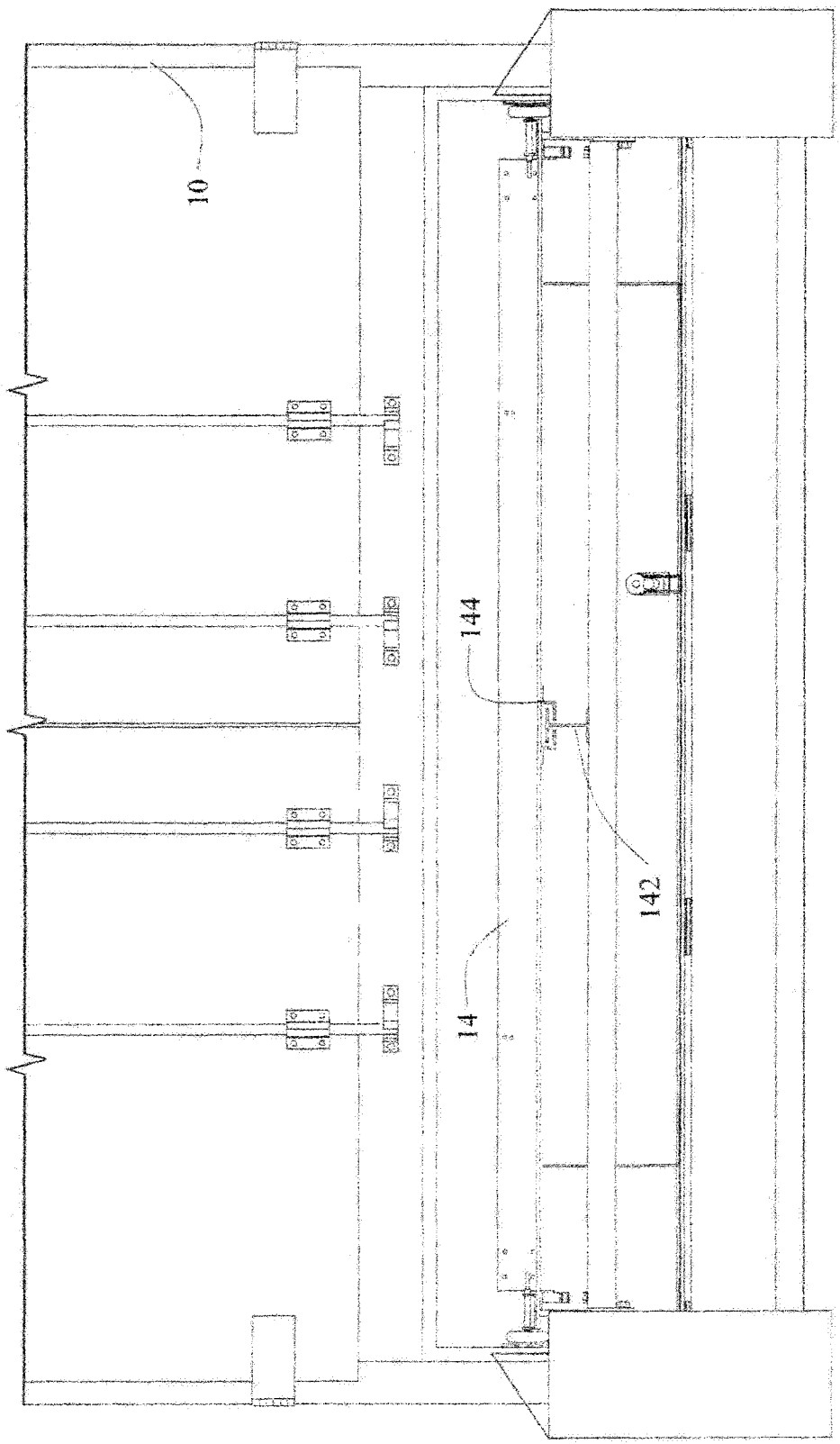
FIG. 30 is an end view showing a portion of the modular storage structure, e.g., a steel storage container or housing, with the open deployment door, a wheeled support frame (solar panel omitted) being deployed, formed flat concrete surfaces with an attached, formed, raised-edge, metal profile used for wind-shielding and an interlocking 'bar/bracket' attachment system which prevents the wheels of said wheeled support frames/solar panels from 'lifting' off of the flat surfaces due to axial or radial wind currents.

FIG. 27 and FIG. 28 are isometric views to illustrate a further embodiment of this invention, in which a guide bar 142 may extend from the deployment door 120 of the container or housing 10 as a guide for the travel of the support frames 14. In this embodiment, the guide bar is in the form of an I-beam with a top horizontal flange, and with the support frames 14 each have brackets 144 that are configured to slide along the top flange of the guide bar 142. This serves the same purpose as the guide wires or cables 42 of previously discussed embodiments. Detail of the bracket 144 and guide bar 142 are shown in FIG. 29, while in FIG. 30, which is an end view of the container or housing 10, a wheeled support frame 14, the flat concrete footer (not numbered here) with its formed metal edge feature, and the interlocking relation of the bar 142 and bracket 144. The interlocking bar 142 and bracket 144 do not touch except when there is 'lift' that may occur due to axial or radial wind currents.

Figure 31:
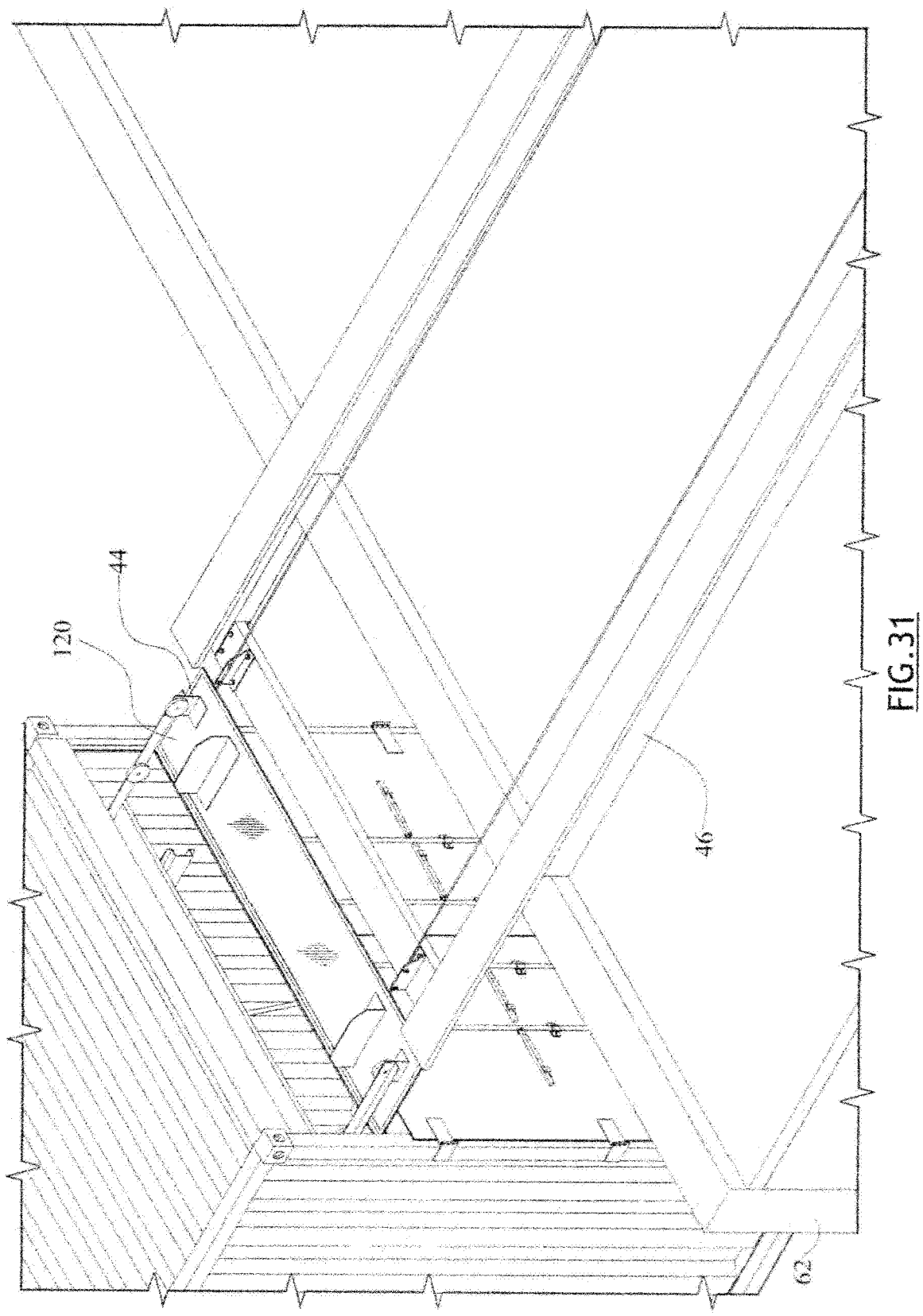
FIG. 31 is a partial isometric view, here showing an embodiment of the modular storage structure, e.g., a steel storage container or housing in a recessed application, with a top located open deployment door, rollers, formed flat concrete surfaces and the taut cable/metal rod system applied which prevents the wheels of said wheeled support frames/solar panels from 'lifting' off of the flat surfaces due to axial or radial wind currents.

FIG. 31 is an isometric view of another embodiment, where the steel storage container or housing 10 is situated in a recessed application, with a top-located deployment door 20, here shown as open. This embodiment also has flat concrete footers as well as guide wires or cables 42 or equivalent elongated metal rods that secure the wheeled support frames and solar panel. Here, the land surface is just below the location of the concrete footers that support the support frames and solar panels, and so a ground cover adapted for weed control is disposed along the ground surface.

Figure 32:
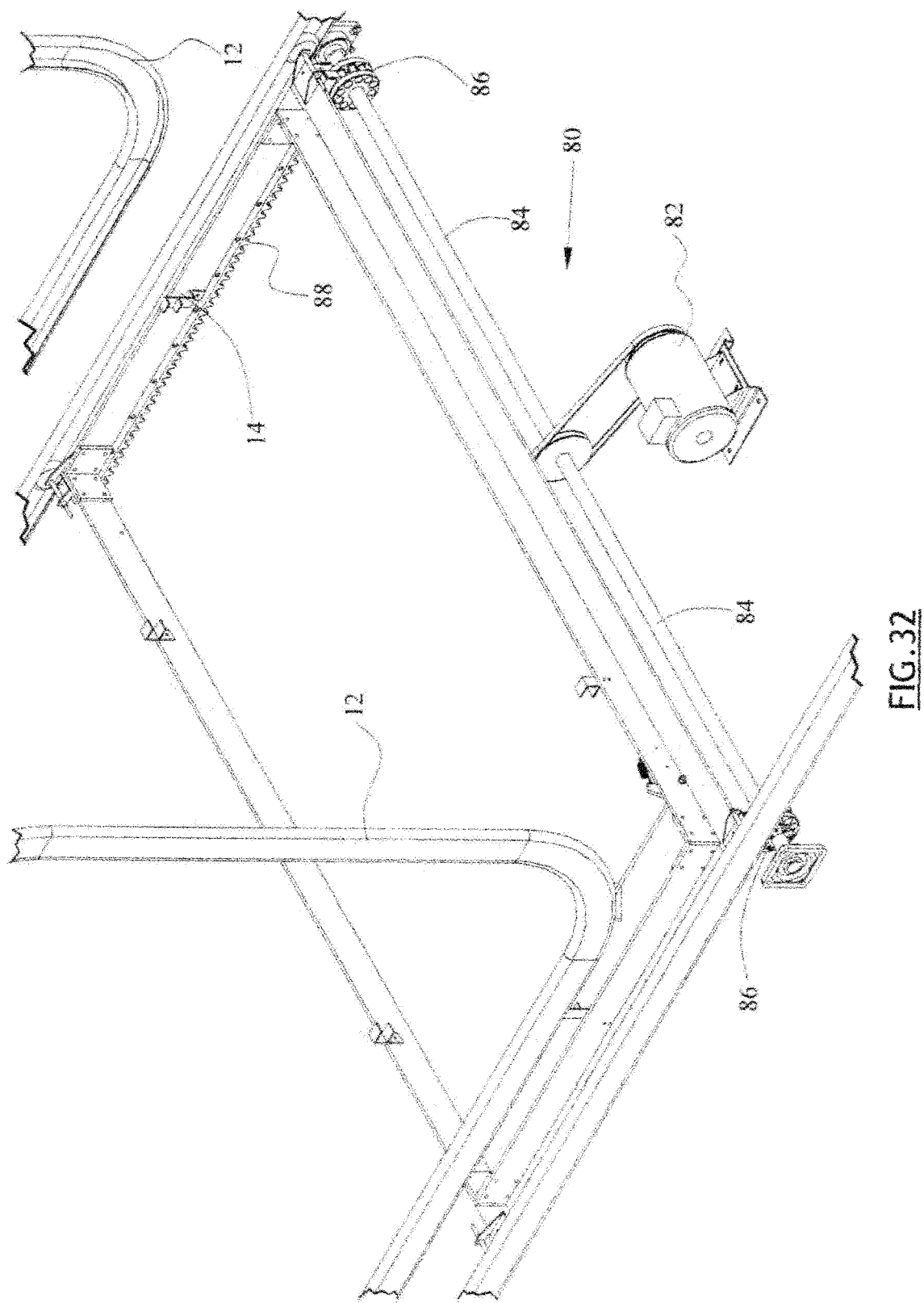
FIG. 32 is a partial isometric view of an embodiment showing a motorized sprocket-and-rack drive system for controlled movement of the support frames/solar panels.
Figure 33:
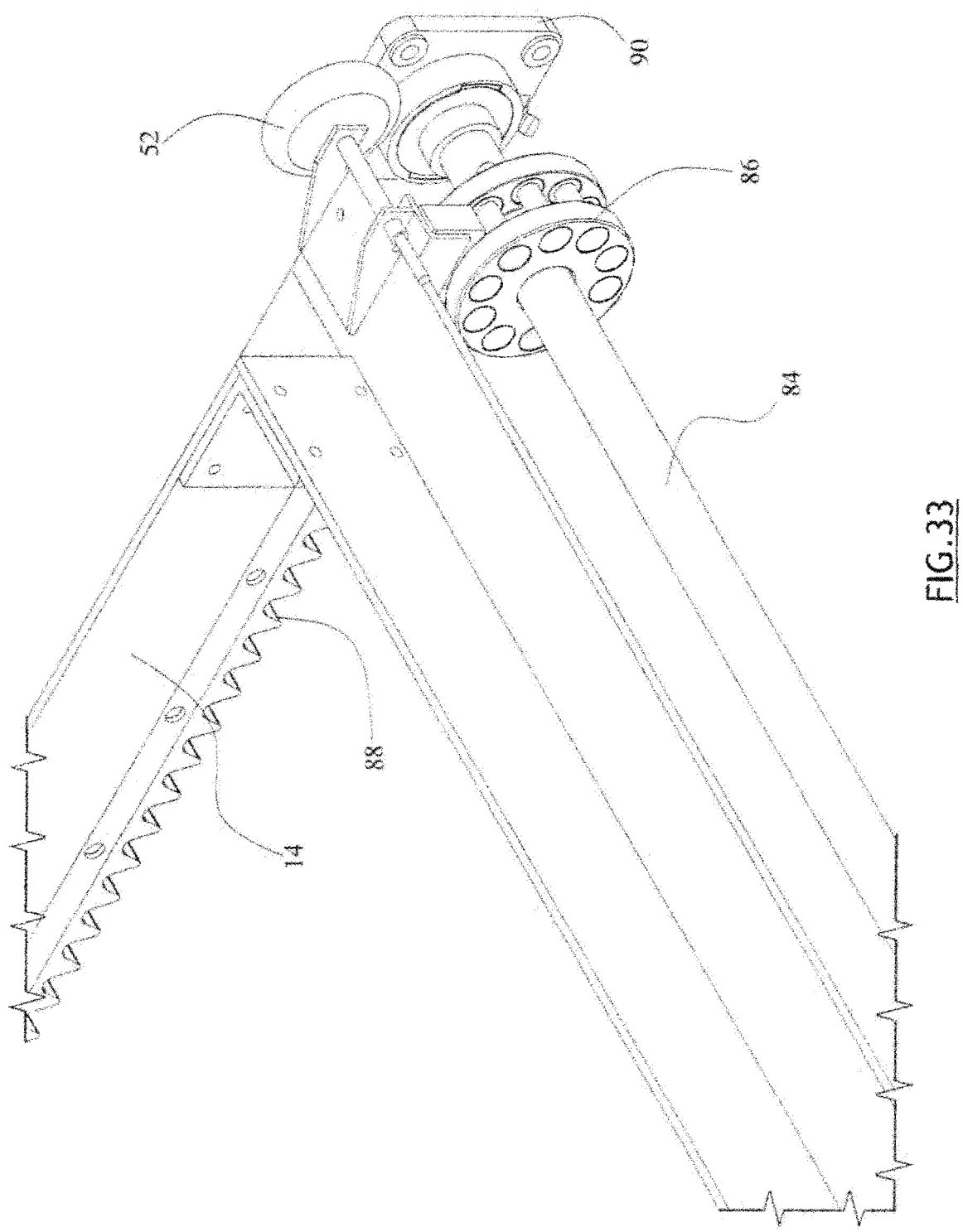
FIG. 33 is a detail view of a portion thereof illustrating the roller drive sprocket and the toothed rack of an associated one of the support frames.

One possible drive system 80 for rolling the series of support frames 14 and solar panels 16 to deploy them out from the container or housing 10 and to redeploy them back into the container or housing is illustrated here in FIGS. 32 and 33. The drive system employs a motor 82 to rotate a transverse drive shaft 84. The motor may favorably be a reversible motor, or may incorporate a reversible gear drive so that the shaft 84 may be driven in either direction. There are sprocket wheels 86 mounted at each of the right and left ends of the shaft 84 and positioned to engage left and right linear racks 88 on each of the support frames 14. Each sprocket wheel 86 is comprised of a series of rollers supported in circular support disks, and the associated racks 88 are each formed as a series of rounded teeth that are configured to match the geometry of the sprocket wheel rollers. This ensures that the roller sprockets and linear racks provide nearly frictionless drive to the support frames 14 during deployment and redeployment. Bearings 90 are provided at each end of the drive shaft 84, which are positioned to provide sufficient clearance for the wheels or rollers 52 of the support frames, as shown in FIG. 33.

While the main concepts of this invention are explained with reference so several selected embodiments, the invention is not to be limited to those specific embodiments. Rather, many modifications and variations would present themselves to persons of skill in this art without departing from the scope and spirit of this invention, as defined in the appended Claims.

What is claimed is:

1. A fixed or transportable energy collection and storage station comprising:
   at least one linear array of photovoltaic panels including linkages flexibly connecting said panels one to the next in the form of a chain of multiple interconnected panels;
   a housing in which said array of photovoltaic panels is stored, and having a deployment port through which said linear array of photovoltaic panels are deployed out and through which said array of photovoltaic panels are retracted back in;
   at least one track affixed as a coil or loop within said housing and each said track being configured in at least an upper portion, a lower portion, and a vertical portion joining an end of the upper portion with a corresponding end of the lower portion of the track and defining a folded path within the housing to carry a respective one of said at least one linear array of photovoltaic panels along said folded path, with each of said panels having at least one traveler member therein engaging said track and held therein such that said photovoltaic panels are limited to motion in a direction along the folded path of said track; and
   a drive mechanism for moving said photovoltaic panels along said track for deploying said array of photovoltaic panels out said deployment port onto said a land surface and for retracting said linear array of said panels back into said housing.

2. The fixed or transportable energy collection and storage station according to claim 1, wherein said land surface comprises at least one track formed of a pair of rails of C-shaped profile.

3. The fixed or transportable energy collection and storage station according to claim 1, wherein said land surface includes at least a pair of rigid solid ribbon surfaces on which the traveler member of said panels can travel.

4. The fixed or transportable energy collection and storage station according to claim 3, wherein said ribbon surfaces include strips of concrete.

5. The fixed or transportable energy collection and storage station according to claim 4, further including raised flat sections of said concrete shaped to serve as wind deflectors.

6. The fixed or transportable energy collection and storage station according to claim 1, wherein said at least one internal track includes a pair of coils of rail of generally C-shaped profile, said track having a substantially horizontal lower portion, a substantially horizontal upper portion, and at least one substantially vertical portion joining the lower and upper portions.

7. The fixed or transportable energy collection and storage station according to claim 6, further comprising external track members extending from outside said deployment port, and at least on rotatable bridging member adapted for selectively joining said internal track and said external track members.

8. The fixed or transportable energy collection and storage station according to claim 1, wherein each photovoltaic panel includes a photoelectric upper portion that converts sunlight to electricity, and a carriage beneath the upper portion on which the upper portion is mounted, said carriage including a plurality of rollers or wheels to serve as said travelers.

9. The fixed or transportable energy collection and storage station according to claim 8, further comprising at least one taut guide wire or cable that extends outward along said land surface from said deployment port; and each said carriage including a cam actuated hook latch that is adapted to latch onto said guide wire or cable when the associated photovoltaic panel exits said deployment port.

10. The fixed or transportable energy collection and storage station according to claim 1, comprising a drive mechanism within said housing for moving the associated chain of interconnected panels along said folded path to deploy out through said deployment port and to retract back through said deployment port.

11. The fixed or transportable energy collection and storage station according to claim 10, wherein said drive mechanism includes a pair of drive sprockets situated at left and right sides of said deployment port and each of said carriages has left and right toothed rack members along left and right edges thereof configured to engage said drive sprockets.

12. The fixed or transportable energy collection and storage station according to claim 11, wherein each of said drive sprockets is configured as a roller sprocket, and includes a ring of roller members supported between a pair of sprocket disks.

* * * * *